(12) United States Patent
Shinotsuka et al.

(10) Patent No.: US 9,105,878 B2
(45) Date of Patent: Aug. 11, 2015

(54) ORGANIC LIGHT-EMITTING DIODE MANUFACTURING METHOD, ORGANIC LIGHT-EMITTING DIODE, IMAGE DISPLAY DEVICE, ILLUMINATION DEVICE, AND SUBSTRATE

(75) Inventors: Kei Shinotsuka, Kawasaki (JP); Takayuki Okamoto, Niiza (JP); Etsuko Kawamukai, Narashino (JP); Norio Yamamura, Yokohama (JP)

(73) Assignee: Oji Holdings Corporation, Tokyo (JP)

( * ) Notice: Subject to any disclaimer, the term of this patent is extended or adjusted under 35 U.S.C. 154(b) by 0 days.

(21) Appl. No.: 14/127,602

(22) PCT Filed: Jun. 28, 2012

(86) PCT No.: PCT/JP2012/066556
§ 371 (c)(1),
(2), (4) Date: Feb. 4, 2014

(87) PCT Pub. No.: WO2013/005638
PCT Pub. Date: Jan. 10, 2013

(65) Prior Publication Data
US 2014/0167017 A1 Jun. 19, 2014

(30) Foreign Application Priority Data
Jul. 1, 2011 (JP) .................. 2011-147195

(51) Int. Cl.
*H01L 51/56* (2006.01)
*H01L 51/52* (2006.01)
(Continued)

(52) U.S. Cl.
CPC ............ *H01L 51/56* (2013.01); *H01L 51/0017* (2013.01); *H01L 51/5036* (2013.01);
(Continued)

(58) Field of Classification Search
CPC ................ H01L 51/5268; H01L 51/5203
USPC .................................... 257/40; 438/46, 156
See application file for complete search history.

(56) References Cited

U.S. PATENT DOCUMENTS 8,759,820 B2 * 6/2014 Godo et al. ............... 257/40
2009/0066241 A1 3/2009 Yokoyama

FOREIGN PATENT DOCUMENTS

JP   A-2002-270891   9/2002
JP   A-2004-031350   1/2004
(Continued)

OTHER PUBLICATIONS

International Search Report issued in PCT/JP2012/066556 on Aug. 21, 2012.
(Continued)

*Primary Examiner* — Cuong Q Nguyen
(74) *Attorney, Agent, or Firm* — Knobbe Martens Olson & Bear LLP

(57) ABSTRACT

A method of manufacturing an organic light-emitting diode including preparing, by a dry etching method using a particle single layer film as an etching mask, a substrate provided with an uneven structure in which a plurality of unevenness is arranged in two dimensions on the surface of the substrate, and stacking, on the uneven structure, at least an anode conductive layer, an EL layer including a light-emitting layer containing an organic light-emitting material, and a cathode conductive layer containing a metal layer, such that the uneven structure is reproduced on the surface of the metal layer on the side of the EL layer, wherein the particle single layer film is formed using a mixture of a plurality of particles having different particle sizes, and an uneven structure is provided which satisfies particular requirements.

11 Claims, 9 Drawing Sheets

(51) Int. Cl.
  *H05B 33/02* (2006.01)
  *H05B 33/10* (2006.01)
  *H01L 51/00* (2006.01)
  *H01L 51/50* (2006.01)

(52) U.S. Cl.
  CPC ............ *H01L51/52* (2013.01); *H01L 51/5268* (2013.01); *H01L 51/5275* (2013.01); *H05B 33/02* (2013.01); *H05B 33/10* (2013.01); *H01L 51/5203* (2013.01); *Y10T 428/24479* (2015.01)

(56) References Cited

FOREIGN PATENT DOCUMENTS

| JP | A-2005-535121 | 11/2005 |
|----|---------------|---------|
| JP | 2006-269163 A | 10/2006 |
| JP | A-2006-313667 | 11/2006 |
| JP | A-2009-158478 | 7/2009 |
| JP | A-2010-097873 | 4/2010 |
| JP | A-2010-129301 | 6/2010 |
| JP | A-2010-527108 | 8/2010 |
| JP | A-2010-192366 | 9/2010 |
| JP | A-2010-198830 | 9/2010 |
| WO | WO 2004/013921 | 2/2004 |
| WO | WO 2008/140675 | 11/2008 |

OTHER PUBLICATIONS

Ho Yu-Hsuan et al., "Transparent and conductive metallic electrodes fabricated by using nanosphere lithography", Organic Electronics, Elsevier, Amsterdam, NL, vol. 12, No. 6, Mar. 23, 2011, pp. 961-965.
Chang et al., "Surface plasmon generation and light transmission by isolated nanoholes and arrays of nanoholes in thin metal films ", Optics Express, vol. 13, No. 8, Apr. 18, 2005, p. 9144.
Hyungsoon Im et al., "Atomic layer deposition of dielectric overlayers for enhancing the optical properties and chemical stability of plasmonic nanoholes", ACS nano, vol. 4, No. 2, Feb. 23, 2010, pp. 947-954.
Wang B et al., "Formation of nanoimprinting mould through use of nanosphere lithography", Journal of Crystal Growth, Elsevier, Amsterdam, NL, vol. 288, No. 1, Feb. 2, 2006, pp. 200-204.
Holger Fischer et al., "Engineering the optical response of plasmonic nanoantennas", Optics Express, vol. 16, No. 12, Jun. 9 2008, p. 9144.
European Search Report in Application No. 12808193.2, mailed on Mar. 6, 2015.

* cited by examiner

ORGANIC LIGHT-EMITTING DIODE MANUFACTURING METHOD, ORGANIC LIGHT-EMITTING DIODE, IMAGE DISPLAY DEVICE, ILLUMINATION DEVICE, AND SUBSTRATE

TECHNICAL FIELD

The present invention relates to an organic light-emitting diode manufacturing method, an organic light-emitting diode, an image display device, an illumination device and a substrate.

Priority is claimed on Japanese Patent Application No. 2011-147195, filed Jul. 1, 2011, the content of which is incorporated herein by reference.

BACKGROUND ART

Organic light-emitting diodes are light-emitting elements that use organic electroluminescence (hereafter, "electroluminescence" is abbreviated as "EL"), and generally have a structure in which conductive layers (an anode conductive layer and a cathode conductive layer) are provided on opposing surfaces of an EL layer containing a light-emitting layer which contains an organic light-emitting material. Besides the light-emitting layer, the EL layer may be provided with an electron transport layer or a hole transport layer or the like as required. Organic light-emitting diodes include bottom emission structures, in which an anode conductive layer formed from a transparent conductive material such as ITO, an EL layer, and a cathode conductive layer are formed sequentially on top of a transparent substrate such as a glass substrate, and the light is extracted from the substrate side of the structure, and top emission structures in which a cathode conductive layer, an EL layer and an anode conductive layer are formed sequentially on top of a substrate, and light is extracted from the opposite side of the structure from the substrate.

Organic light-emitting diodes offer a variety of advantages, including minimal view angle dependency, minimal power consumption and an ability to form extremely thin devices, but suffer from a problem of low light extraction efficiency. The light extraction efficiency is the ratio of the amount of light emitted into the atmosphere from the light extraction surface (for example, the substrate surface in the case of a bottom emission structure), relative to the amount of light emitted from the organic light-emitting material. For example, because the light from the light-emitting layer is emitted in all directions, the majority of the light enters a guided mode in which total reflection occurs repeatedly at the interfaces between a plurality of layers having different refractive indices, and this light is either converted to heat during guiding through the layers or is emitted from a side surface, resulting in a reduction in the light extraction efficiency. Further, because the distance from the metal cathode conductive layer is small, a portion of the near-field light from the organic light-emitting material is converted to a surface plasmon at the surface of the cathode and lost, resulting in a reduction in the light extraction efficiency. The light extraction efficiency effects the brightness of a display or illumination device equipped with the organic light-emitting diode, and therefore a multitude of methods for improving the light extraction efficiency are under investigation.

One method that has been proposed for improving the light extraction efficiency is a method that utilizes surface plasmon resonance. For example, Patent Documents 1 to 4 disclose methods in which a one-dimensional or two-dimensional periodic microstructure is provided on the surface of the metal layer (cathode conductive layer). The periodic microstructure formed on the metal layer surface functions as a diffraction grating, converting the surface plasmon into light at the cathode surface. As a result, the energy lost as surface plasmon can be extracted as light, thereby increasing the light extraction efficiency.

Of the above documents, Patent Document 4 discloses a method in which a substrate having a periodic lattice structure formed by surface unevenness is prepared using a dry etching method which employs a two-dimensional crystal body formed from a particle single layer film as an etching mask, and an anode conductive layer, a light-emitting layer and a cathode conductive layer are then stacked sequentially on top of the substrate. In this method, during the stacking process, the periodic lattice structure on the substrate surface is transferred sequentially to the upper layers, and therefore a periodic lattice structure having a shape that represents a reproduction of the periodic lattice structure of the substrate surface is formed on the surface of the cathode conductive layer on the side of the light-emitting layer.

DOCUMENTS OF RELATED ART

Patent Documents

Patent Document 1: Japanese Unexamined Patent Application, First Publication No. 2002-270891
Patent Document 2: Japanese Unexamined Patent Application, First Publication No. 2004-31350
Patent Document 3: Published Japanese Translation No. 2005-535121 of PCT
Patent Document 4: Japanese Unexamined Patent Application, First Publication No. 2009-158478

SUMMARY OF THE INVENTION

Problems to be Solved by the Invention

Until now, the types of periodic microstructures described above have been prepared so that the period of the unevenness remains constant. This is because a period that is constant, namely a structure in which the spacing of the unevenness within the microstructure is constant, is effective in improving the extraction efficiency of light of a specific single wavelength. However, if the spacing of the unevenness is constant, then achieving an improvement in the light extraction efficiency is difficult for white light-emitting diodes, for which the extracted wavelength region spans the entire visible light region (380 nm to 780 nm), or for organic light-emitting diodes having an even broader wavelength range, such as those for which the extracted wavelength region spans the entire region from visible light through to the near infrared region (380 nm to 2,500 nm).

The present invention has been developed in light of the above circumstances, and has an object of providing a method of manufacturing an organic light-emitting diode that exhibits excellent extraction efficiency of light across an arbitrary broad wavelength region within the region from visible light through to the infrared region, an organic light-emitting diode that exhibits excellent extraction efficiency of light across the entire visible light region, an image display device and an illumination device which contain the organic light-emitting diode, and a substrate that is useful for manufacturing the organic light-emitting diode.

Means to Solve the Problems

In order to achieve the above object, a method of manufacturing an organic light-emitting diode according to a first aspect of the present invention includes a substrate preparation step of preparing, by a dry etching method using a particle single layer film as an etching mask, a substrate provided with an uneven structure in which a plurality of unevenness is arranged in two dimensions on the surface of the substrate, and a deposition step, on the uneven structure, at least an anode conductive layer, an electroluminescent layer including a light-emitting layer containing an organic light-emitting material, and a cathode conductive layer containing a metal layer, such that the uneven structure is reproduced on the surface of the metal layer on the side of the electroluminescent layer, wherein in the substrate preparation step, the particle mono layer film is formed using a mixture of a plurality of particles having different particle sizes, and a substrate having an uneven structure which satisfies the following requirements (A) and (B) is prepared.

Requirement (A): the average height is at least 15 nm but not more than 150 nm.

Requirement (B): the spectral intensity of the height distribution has a finite value across the entire range in which the absolute value |k| of a wave number is denoted by formula (I) shown below, and the integral value of the spectral intensity across the range accounts for 35% or more of the integral value of the spectral intensity across the entire wave number range.

Here, the term "wave number" indicates the value obtained by multiplying the spatial frequency of the height distribution by $2\pi$.

[Mathematical Formula 1]

$$\mathrm{Re}\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \leq$$
$$|k| \leq \mathrm{Re}\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right] \quad (I)$$

$\in_m(\lambda)$ represents the relative dielectric constant of the metal that constitutes the metal layer.

$\in_d(\lambda)$ represents the equivalent relative dielectric constant of the EL layer.

$\lambda_{max}$ represents the maximum extracted wavelength, and $\lambda_{min}$ represents the minimum extracted wavelength.

Re[ ] denotes the real part of a complex number.

A method of manufacturing an organic light-emitting diode according to a second aspect of the present invention includes a substrate preparation step of coating the surface of a base plate with a particle single layer film, dry etching the base plate using the particle mono layer film as an etching mask, thereby preparing a template having an uneven structure in which a plurality of unevenness is arranged in two dimensions on the surface of the template, and then preparing a substrate by transferring the uneven structure on the surface of the template at least once to another base plate, and a deposition step, on the uneven structure that has been transferred to the substrate, at least an anode conductive layer, an electroluminescent layer including a light-emitting layer containing an organic light-emitting material, and a cathode conductive layer containing a metal layer, such that the uneven structure is reproduced on the surface of the metal layer on the side of the electroluminescent layer, wherein in the substrate preparation step, the particle mono layer film is formed using a mixture of a plurality of particles having different particle sizes, and a template having an uneven structure which satisfies the following requirements (A) and (B) is prepared.

Requirement (A): the average height is at least 15 nm but not more than 150 nm.

Requirement (B): the spectral intensity of the height distribution has a finite value across the entire range in which the absolute value |k| of a wave number is denoted by formula (I) shown below, and the integral value of the spectral intensity across the range accounts for 35% or more of the integral value of the spectral intensity across the entire wave number range.

[Mathematical Formula 2]

$$\mathrm{Re}\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \leq$$
$$|k| \leq \mathrm{Re}\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right] \quad (I)$$

$\in_m(\lambda)$ represents the relative dielectric constant of the metal that constitutes the metal layer.

$\in_d(\lambda)$ represents the equivalent relative dielectric constant of the electroluminescent layer.

$\lambda_{max}$ represents the maximum extracted wavelength, and $\lambda_{min}$ represents the minimum extracted wavelength.

Re[ ] denotes the real part of a complex number.

An organic light-emitting diode of a third aspect of the present invention has a stacked structure in which at least an anode conductive layer, an electroluminescent layer including a light-emitting layer containing an organic light-emitting material, and a cathode conductive layer containing a metal layer are stacked on an uneven structure of a substrate provided with the uneven structure in which a plurality of unevenness is arranged in two dimensions on the surface of the substrate, such that the uneven structure is reproduced on the surface of the metal layer on the side of the electroluminescent layer, wherein the uneven structure satisfies the following requirements (A1) and (B1).

Requirement (A1): the average height is at least 15 nm but not more than 150 nm.

Requirement (B1): the spectral intensity of the height distribution has a finite value across the entire range in which the absolute value |k| of a wave number is denoted by formula (I) shown below, and the integral value of the spectral intensity across the range accounts for 35% or more of the integral value of the spectral intensity across the entire wave number range.

[Mathematical Formula 3]

$$\mathrm{Re}\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \leq$$
$$|k| \leq \mathrm{Re}\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right] \quad (I)$$

$\in_m(\lambda)$ represents the relative dielectric constant of the metal that constitutes the metal layer.

$\in_d(\lambda)$ represents the equivalent relative dielectric constant of the electroluminescent layer.

$\lambda_{max}$ and $\lambda_{min}$ represent the maximum value and the minimum value respectively in a region that includes part or all of the emission spectrum of the organic light-emitting diode, wherein $\lambda_{max}-\lambda_{min}>200$ nm.

Re[ ] denotes the real part of a complex number.

An image display device of a fourth aspect of the present invention has an organic light-emitting diode manufactured using the manufacturing method of the first aspect or the second aspect in at least a portion of the device.

An illumination device of a fifth aspect of the present invention has an organic light-emitting diode of the third aspect in at least a portion of the device.

An illumination device of a sixth aspect of the present invention has an organic light-emitting diode manufactured using the manufacturing method of the first or second aspect in at least a portion of the device.

An illumination device of a seventh aspect of the present invention has an organic light-emitting diode of the third aspect in at least a portion of the device.

A substrate of an eighth aspect of the present invention is provided with an uneven structure in which a plurality of unevenness is arranged in two dimensions on the surface of the substrate, wherein the uneven structure satisfies the following requirements (A2) and (B2).

Requirement (A2): the average height is at least 15 nm but not more than 150 nm.

Requirement (B2): the spectral intensity of the height distribution has a finite value across the entire range in which the absolute value |k| of a wave number is denoted by formula (II) shown below, and the integral value of the spectral intensity across the range accounts for 35% or more of the integral value of the spectral intensity across the entire wave number range.

[Mathematical Formula 4]

$$k_1 \le |k| \le k_2 \quad (II)$$

In formula (II), the values of $k_1$ and $k_2$ satisfy formulas (III) and (IV) shown below.

[Mathematical Formula 5]

$$13\ \mu m^{-1} < k_1, k_2 < 37\ \mu m^{-1} \quad (III)$$

$$k_2 - k_1 \ge 8\ \mu m^{-1} \quad (IV)$$

Effects of the Invention

The present invention is able to provide a method of manufacturing an organic light-emitting diode that exhibits excellent extraction efficiency of light across an arbitrary broad wavelength region within the region from visible light through to the infrared region, an organic light-emitting diode that exhibits excellent extraction efficiency of light across the entire visible light region, an image display device and an illumination device which contain the organic light-emitting diode, and a substrate that is useful for manufacturing the organic light-emitting diode.

EMBODIMENTS FOR CARRYING OUT THE INVENTION

<<Method of Manufacturing Organic Light-emitting Diode>>

=First Aspect=

Figure 1:
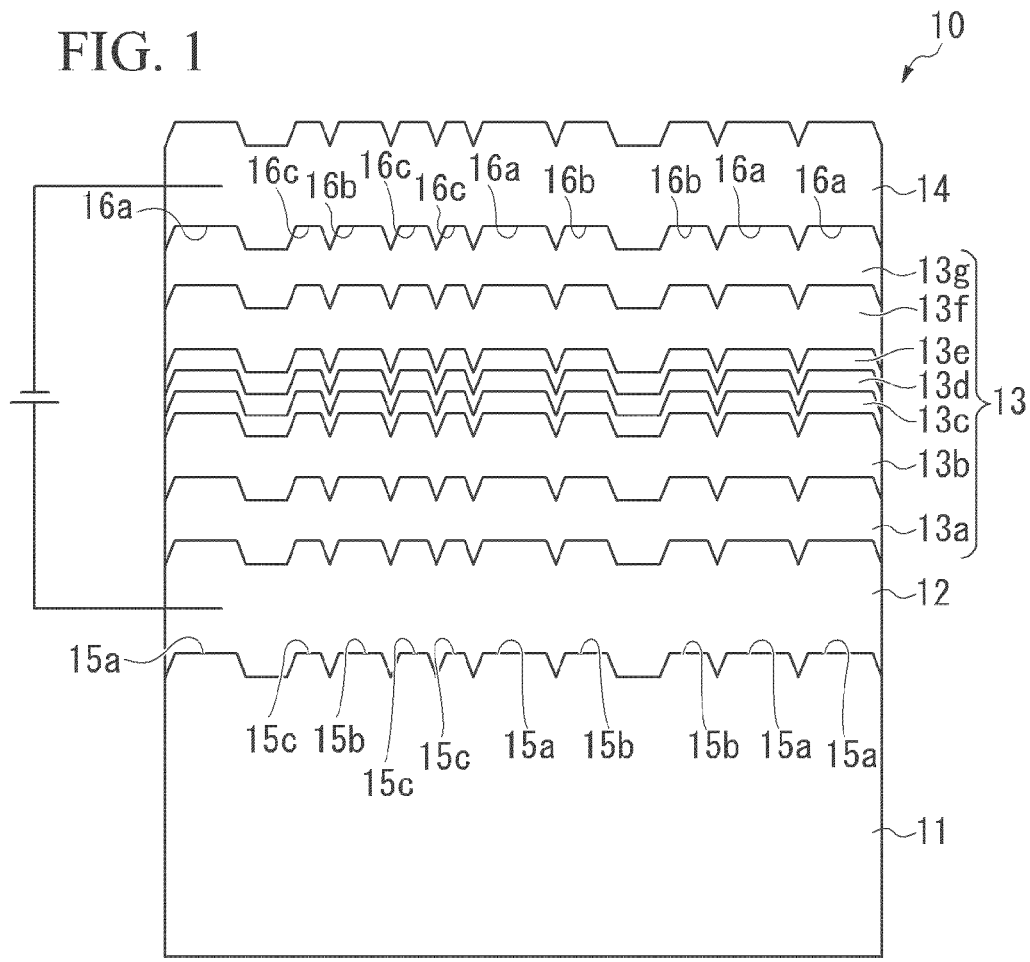
FIG. 1 is a schematic view illustrating one example of the structure of an organic light-emitting diode manufactured using the manufacturing method according to the first aspect of the present invention.

The method of manufacturing an organic light-emitting diode according to the first aspect of the present invention includes a substrate preparation step of preparing, by a dry etching method using a particle single layer film as an etching mask, a substrate provided with an uneven structure in which a plurality of unevenness is arranged in two dimensions (hereafter also referred to as a "two-dimensional uneven structure") on the surface of the substrate, and a deposition step, on the uneven structure, at least an anode conductive layer, an electroluminescent layer including a light-emitting layer containing an organic light-emitting material, and a cathode conductive layer containing a metal layer, such that the uneven structure is reproduced on the surface of the metal layer on the side of the electroluminescent layer, wherein in the substrate preparation step, the particle mono layer film is formed using a mixture of a plurality of particles having different particle sizes, and a substrate having an uneven structure which satisfies the following requirements (A) and (B) is prepared.

Requirement (A): the average height is at least 15 nm but not more than 150 nm.

Requirement (B): the spectral intensity of the height distribution has a finite value when the absolute value |k| of a wave number is within the range denoted by formula (I) shown above, and the integral value of the spectral intensity across the range accounts for 35% or more of the integral value of the spectral intensity across the entire wave number range.

A more detailed description is provided below, but by ensuring that the uneven structure on the substrate surface satisfies the above requirements (A) and (B), the two-dimensional uneven structure formed on the surface of the metal layer on the side of the EL layer will also satisfy the requirements (A) and (B). As a result, the extraction efficiency of light across an arbitrary broad wavelength region within the region from visible light through to the near infrared region (380 nm to 2,500 nm) can be increased dramatically.

In other words, when light is emitted from the organic light-emitting material of the light-emitting layer within the EL layer, near-field light is generated in the very close vicinity. Because the distance between the light-emitting layer and the metal layer is extremely small, the near-field light is converted to transmission surface plasmon energy at the surface of the metal layer.

With the transmission surface plasmon at the metal surface, a compression wave of free electrons accompanies the surface electromagnetic field. In the case of a surface plasmon that exists on a flat metal surface, because the dispersion curve of the surface plasmon and the dispersion line of the light (space propagation light) do not intersect, the surface plasmon cannot be extracted as light. In contrast, if a fine structure of the nanometer order exists on the metal surface, then the dispersion curve of the space propagation light diffracted by this fine structure intersects with the dispersion curve of the surface plasmon, enabling the energy of the surface plasmon to be extracted as radiant light. Accordingly, by providing a two-dimensional uneven structure on the surface of the metal layer on the side of the EL layer, the light energy lost as the surface plasmon can be extracted, and the extracted energy is emitted from the surface of the metal layer as radiant light. The directivity of the light radiated from the metal layer at this time is very high, and the majority of the light is directed toward the extraction surface (either the substrate-side surface or the opposite surface of the organic light-emitting diode). As a result, high-intensity light is emitted from the extraction surface, and the extraction efficiency improves.

Conventionally, two-dimensional uneven structures have been formed as lattice structures having a high degree of periodicity. For example, in Patent Document 4, particles of a single particle size are used to form a particle single layer film having minimal misalignment, and a dry etching method using this film as an etching mask is used to prepare a substrate having a periodic lattice structure, thereby forming a periodic lattice structure on the surface of the metal layer on the side of the light-emitting layer. In contrast, in the present invention, because the particle mono layer film is formed using a mixture of a plurality of particles having different particle sizes, the two-dimensional uneven structure that is finally formed on the surface of the metal layer on the side of the EL layer has low periodicity, and the concave portions and convex portions are distributed randomly. This randomness of the two-dimensional uneven structure contributes to an improvement in the extraction efficiency of light across a broad range.

The randomness of the two-dimensional uneven structure is reflected in the above requirement (B). For example, if the particle mono layer film is formed using particles of a single particle size, then for the formed uneven structure, the spectral intensity of the height distribution does not have a finite value across the entire range in which the absolute value |k| of a wave number is denoted by formula (I).

The manufacturing method of the first aspect of the present invention is described below by illustrating an embodiment using the appended drawings.

<<First Embodiment>>

A schematic cross sectional view describing the structure of an organic light-emitting diode 10 manufactured using the present embodiment is illustrated in FIG. 1.

The organic light-emitting diode 10 is an organic light-emitting diode having a layer structure generally referred to as a bottom emission type structure, and has an anode conductive layer 12 formed from a transparent conductor, an EL layer 13, and a cathode conductive layer (metal layer) 14 formed from a metal stacked sequentially on top of a transparent substrate 11.

The surface of the transparent substrate 11 on the side that the anode conductive layer 12 is stacked is provided with an uneven structure in which a plurality of truncated cone-shaped convex portions 15a, 15b and 15c having mutually different diameters are arranged randomly in two dimensions. This uneven structure is described below in further detail.

The EL layer 13 is composed of a hole injection layer 13a, a hole transport layer 13b, light-emitting layers 13c, 13d and 13e formed from organic light-emitting materials, an electron transport layer 13f, and an electron injection layer 13g, which are stacked in that order from the side of the anode conductive layer 12. Among these layers, a single layer may sometimes have a single function, or may sometimes combine two or more functions. For example, an electron transport layer and a light-emitting layer can be combined into a single layer.

For each layer within the anode conductive layer 12 and the EL layer 13 (the hole injection layer 13a, the hole transport layer 13b, the light-emitting layers 13c, 13d and 13e, and the electron transport layer 131), an uneven structure the same as that formed on the surface of the transparent substrate 11 is formed on the surface of the layer on the side of the cathode conductive layer 14. On the other hand, a two-dimensional uneven structure having a shape that represents an inversion of the above uneven structure is formed on the surface of each layer within the anode conductive layer 12, the EL layer 13 and the cathode conductive layer 14 on the side of the transparent substrate 11.

A voltage can be applied to the anode conductive layer 12 and the cathode conductive layer 14. By applying a voltage across the anode conductive layer 12 and the cathode conductive layer 14, holes and electrons respectively are injected into the EL layer 13. The injected holes and electrons combine in the light-emitting layer 13c and generate excitons. When these excitons recombine, light is emitted.

[Transparent Substrate 11]

There are no particular limitations on the material used for forming the transparent substrate 11, provided it transmits light of the targeted extraction wavelengths, and an inorganic material, an organic material or a combination thereof may be used. Examples of the inorganic material include various types of glass such as quartz glass, alkali-free glass and super white glass, and transparent inorganic minerals such as mica. Examples of the organic material include resin films such as cycloolefin-based films and polyester-based films, and fiber-reinforced plastic materials such as resin films containing fine fibers such as cellulose nanofibers.

Although dependent upon the intended application, the transparent substrate 11 is generally a material having superior visible light transmittance. In order to prevent spectral bias within the visible light region (wavelength: 380 nm to 780 nm), the visible light transmittance is preferably at least 70%, more preferably 80% or higher, and still more preferably 90% or higher.

The uneven structure in which a plurality of truncated cone-shaped convex portions 15a, 15b and 15c having mutually different diameters are arranged randomly in two dimensions (hereafter also referred to as a "truncated cone uneven structure") is provided on the surface of the transparent substrate 11 on the side the anode conductive layer 12 is stacked. By sequentially stacking the anode conductive layer 12, the EL layer 13 (the hole injection layer 13a, the hole transport layer 13b, the light-emitting layer 13c and the electron transport layer) 13f on top of this truncated cone uneven structure, a truncated cone uneven structure the same as that formed on the surface of the transparent substrate 11 is formed on the surface of each layer on the side of the cathode conductive layer 14. As a result, when the cathode conductive layer 14 is finally stacked on the EL layer 13, a two-dimensional uneven structure having a shape that represents an inversion of the truncated cone uneven structure on the surface of the transparent substrate 11, namely a two-dimensional uneven structure in which a plurality of inverted truncated cone-shaped concave portions 16a, 16b and 16c having mutually different diameters are arranged randomly in two dimensions (hereafter also referred to as an "inverted truncated cone uneven structure"), is formed on the surface of the cathode conductive layer 14 on the side of the EL layer 13.

The diameters and depths of the concave portions 16a, 16b and 16c in the inverted truncated cone uneven structure match the diameters and heights of the convex portions 15a, 15b and 15c respectively in the truncated cone uneven structure. Further, the arrangement pattern of the concave portions 16a, 16b and 16c in the inverted truncated cone uneven structure matches the arrangement pattern of the convex portions 15a, 15b and 15c in the truncated cone uneven structure.

Here, the expression "arranged randomly in two dimensions" indicates a state in which the plurality of convex portions 15a, 15b and 15c (or the concave portions 16a, 16b and 16c) are disposed in the same plane, but in a manner such that the spacing between the centers of the portions and the direction of alignment are not constant. By using a random arrangement in two dimensions, light can be extracted efficiently across a broad region. In the case of a one-dimensional pattern (where the direction of alignment is along a single direction, such as a structure in which a plurality of grooves (or peaks) are arranged in parallel), or a pattern arranged periodically in two dimensions (where the structure has a constant spacing in at least two directions, such as a triangular lattice (hexagonal lattice) or a square lattice), even if the extraction efficiency is improved for light of one particular wavelength, the extraction efficiency for light of other wavelengths remains unsatisfactory.

The transparent substrate 11 in the present embodiment is prepared by coating the surface of a base plate with a particle single layer film, and then using the particle mono layer film as an etching mask to perform dry etching of the base plate.

By using the particle mono layer film as an etching mask, the shapes of the convex portions 15a, 15b and 15c reflect the shapes of the particles that constitute the particle mono layer film, and are isotropic in the substrate in-plane direction.

The "base plate" describes the substrate prior to provision of the two-dimensional uneven structure on the surface.

The definition of the circle which indicates the size of a convex portion is described below. In other words, when the substrate surface is observed from a direction perpendicular to the substrate surface (namely, the stacking direction), and attention is focused on a specific convex portion X0, other adjacent convex portions X1, X2, X3 ... Xn exist in locations which surround the convex portion X0. If the saddle point of the col between X0 and X1 is termed x1, and the saddle points of the cols between X0 and the other convex portions are termed x2, x3 ... xn, then the cross section of the convex portion X0 is obtained at the height of the highest of these saddle points. The contour of this cross section is termed L0, and a least squares fit circle is drawn for this contour. This circle is defined as the fit circle C0 which indicates the size of the convex portion X0.

The standard deviation of the distance between the contour L0 and the fit circle C0 is determined, and provided that the coefficient of variation obtained by dividing this standard deviation by the radius of the fit circle C0 is 0.3 or less, the shape of the convex portion X0 can be said to be isotropic in relation to the substrate in-plane direction.

The truncated cone uneven structure on the surface of the transparent substrate 11 must satisfy the requirements (A) and (B) described below.

[Requirement (A)]

Requirement (A): the average height of the convex portions 15a, 15b and 15c is at least 15 nm but not more than 150 nm.

The average height of the convex portions 15a, 15b and 15c is preferably at least 15 nm but not more than 70 nm, more preferably at least 20 nm but not more than 40 nm, and still more preferably at least 20 nm but not more than 30 nm.

If the average height is less than 15 nm or more than 150 nm, then the improvement in the light extraction efficiency is insufficient. The reason for this is as follows. In other words, if the average height of the convex portions 15a, 15b and 15c is less than 15 nm, then the two-dimensional uneven structure is unable to generate satisfactory surface plasmon diffraction waves, and therefore the ability to extract the surface plasmon as radiant light deteriorates. Moreover, if the average height of the convex portions 15a, 15b and 15c exceeds 150 nm, then when the anode conductive layer 12, the EL layer 13 and the cathode conductive layer 14 are stacked, the steepness of the unevenness means that the possibility of short-circuiting of the anode conductive layer 12 and the cathode conductive layer 14 increases undesirably.

The average height of the convex portions 15a, 15b and 15c is measured using an AFM (atomic force microscope). Specifically, first an image is obtained for a single region of 5 μm×5 μm selected randomly from within the truncated cone uneven structure. Subsequently, a diagonal line is drawn through the AFM image, and each of the convex portions 15a, 15b and 15c which intersect the line is classified in terms of diameter and then measured for height. Based on these measured values, an average value is determined for each diameter (namely, an average value for the height of the convex portions 15a, an average value for the height of the convex portions 15b, and an average value for the height of the convex portions 15c). These operations are performed in a similar manner for a total of 25 randomly selected regions of 5 μm×5 μm, and the average values for the heights of the convex portions 15a, 15b and 15c are determined for each region. The average values obtained in this manner for the 25 regions are themselves averaged, and the resulting values are recorded as the average height of the convex portion 15a, the average height of the convex portion 15b, and the average height of the convex portion 15c.

The height of a single convex portion is determined in a similar manner to that described above, by focusing on a specific convex portion X0, determining the saddle points x1, x2, x3 . . . xn of the cols between the convex portion X0 and other surrounding convex portions, and then calculating the difference in height between the average height of the surrounding saddle points and the height at the center of the convex portion X0.

In the present invention, the average height of the convex portion 15a, the average height of the convex portion 15b, and the average height of the convex portion 15c are each at least 15 nm but not more than 150 nm.

The average height of each of the convex portions 15a, 15b and 15c can be adjusted by altering the dry etching conditions when dry etching is performed using the particle mono layer film as an etching mask.

The diameters and average depths of the concave portions 16a, 16b and 16c are the same as the diameters and average heights of the convex portions 15a, 15b and 15c respectively. As a result, the average depths of the concave portions 16a, 16b and 16c can be quantified indirectly from the average heights of the convex portions 15a, 15b and 15c.

[Requirement (B)]

Requirement (B): the spectral intensity of the height distribution of the surface of the truncated cone uneven structure has a finite value, namely a non-zero value, across the entire range in which the absolute value |k| of a wave number is denoted by formula (I) shown below, and the integral value of the spectral intensity across the range accounts for 35% or more of the integral value of the spectral intensity across the entire wave number range.

[Mathematical Formula 6]

$$Re\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \le \quad (I)$$

$$|k| \le Re\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right]$$

Here, the "spectral intensity of the height distribution" is the spectral intensity in the wave number space following a Fourier transformation.

When the requirement (B) is satisfied, the aforementioned spectral intensity in the Fourier transform image (in which the units of the vertical axis and the horizontal axis are the wave number), obtained by performing a two-dimensional Fourier transformation of the AFM (atomic force microscope) image of the uneven structure and then extracting the resulting intensity values, is distributed across the entire wave number region indicated by formula (IA) shown below. In contrast, if the requirement (B) is not satisfied, for example in the case of an uneven structure formed using, as an etching mask, a particle single layer film formed using particles of a single particle size, the spectral intensity has a value only in one wave number absolute value region.

[Mathematical Formula 7]

$$Re\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \sim \quad (I\ A)$$

$$Re\left[\frac{2\pi}{\lambda_{min}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right]$$

$\in_m(\lambda)$ represents the relative dielectric constant of the metal that constitutes the metal layer (cathode conductive layer 14). For the relative dielectric constant of the metal used in the cathode conductive layer, the real part and the imaginary part can be measured simultaneously by ellipsometry. An approximate value can be cited from the literature, and for example, gold is from −240+38i (λ=2,500 nm) to −0.83+6.5i (λ=380 nm), silver is from −230+29i (λ=2,500 nm) to −3.0+0.66i (λ=380 nm), and aluminum is from −660+160i (λ=2,500 nm) to −21.1+4.1i (λ=380 nm) (cited from "Handbook of Optical Constants of Solids", edited by Edward D. Palik, (1998), published by Academic Press).

$\in_d(\lambda)$ represents the equivalent relative dielectric constant of the EL layer. The approximate equivalent relative dielectric constant of the EL layer is within a range from 2.0 to 5.0.

$\lambda_{max}$ represents the maximum extracted wavelength, and $\lambda_{min}$ represents the minimum extracted wavelength.

Re[ ] denotes the real part of a complex number. The actual relative dielectric constant of a metal is a complex number, and therefore the wave number of the surface plasmon also becomes a complex number, but only the real part of the number is necessary as a lattice parameter.

In formula (I), $\lambda_{max}$ and $\lambda_{min}$ can adopt arbitrary values within the range from visible light through to the near infrared region (380 nm to 2,500 nm). However, it is necessary that $\lambda_{max} > \lambda_{min}$.

In terms of the purpose of extracting light across a broad region, the difference between and $\lambda_{max}$ and $\lambda_{min}$ ($\lambda_{max} - \lambda_{min}$) is preferably greater than 200 nm, and more preferably 300 nm or greater.

In order to improve the extraction efficiency of light across the entire visible light region, it is most preferable that $\lambda_{max}$ is 780 nm and $\lambda_{min}$ is 380 nm in formula (I). This type of organic light-emitting diode is useful as a white light organic light-emitting diode having a strong emission intensity in all manner of applications, and particularly in image display devices and illumination devices.

When the uneven structure on the surface is composed of a plurality of concave portions of different diameters arranged randomly in two dimensions on a transparent substrate (hereafter referred to as the transparent substrate 11'), the uneven structure must satisfy the requirements (A") and (B") described below.

Requirement (A"): the average height (average depth) of the concave portions is at least 15 nm but not more than 150 nm.

Requirement (B"): the spectral intensity of the height distribution (depth distribution) of the surface of the transparent substrate 11' has a finite value across the entire range in which the absolute value |k| of a wave number is denoted by formula (I) shown below, and the integral value of the spectral intensity across the range accounts for 35% or more of the integral value of the spectral intensity across the entire wave number range.

The average heights of the concave portions can be measured in the same manner as that described for the average heights of the convex portions 15a, 15b and 15c.

The spectral intensity of the height distribution (depth distribution) of the transparent substrate 11' cam be measured in the same manner as the spectral intensity of the height distribution of the transparent substrate 11.

[Anode Conductive Layer 12]

A transparent conductor that transmits light of the targeted extraction wavelengths is used as the anode conductive layer 12.

There are no particular limitations on the transparent conductor, and conventional materials typically used as transparent conductive materials can be used. Examples include indium tin oxide (ITO), indium zinc oxide (IZO), zinc oxide (ZnO), and zinc tin oxide (ZTO).

The thickness of the anode conductive layer 12 is typically from 50 to 500 nm.

The thickness of each layer that constitutes the organic light-emitting diode 10 can be measured using a spectroscopic ellipsometer, a contact step meter or an AFM or the like.

[EL layer 13]

The EL (electroluminescent) layer 13 includes at least a light-emitting layer containing an organic light-emitting material. The EL layer may be composed solely of the light-emitting layer, but generally includes other layers besides the light-emitting layer. Provided these other layers do not impair the function of the light-emitting layer, they may be formed from organic materials or inorganic materials.

The EL layer 13 in the present embodiment is composed of 7 layers, namely the hole injection layer 13a, the hole transport layer 13b, the light-emitting layers 13c, 13d and 13e, the electron transport layer 13f, and the electron injection layer 13g. Among these layers, the light-emitting layers are the most important, and depending on the layer configuration, the hole injection layer and the electron injection layer may be omitted. Further, the electron transport layer may also function as a light-emitting layer. There are no particular limitations on the materials used for forming these layers, and conventional materials may be used.

Of the above layers, the organic light-emitting materials used for forming the light-emitting layers 13c, 13d and 13e may employ the types of conventional materials used as the organic light-emitting materials for forming organic EL light-emitting layers, and examples include organic compounds that generate fluorescence and/or phosphorescence, compounds in which other substances (host materials) are doped with these organic compounds, and compounds in which these organic compounds are doped with other dopants.

Examples of known organic compounds that generate fluorescence and/or phosphorescence include dye systems, metal complex systems and polymer systems, and any of these may be used. Specific examples of dye-based organic compounds include 1,4-bis[4-(N,N-diphenylaminostyrylbenzene)] (hereafter abbreviated as DPAVB), 2,3,6,7-tetrahydro-1,1,7,7-tetramethyl-1H,5H,11H-10-(2-benzothiazolyl)quinolizino[9,9a,1-gh] coumarin (hereafter abbreviated as coumarin C545T), and the distyrylarylene derivative 4,4'-bis(2,2-diphenyl-ethen-1-yl)biphenyl (hereafter abbreviated as DPVBi). Specific examples of metal complex-based organic compounds include tris(8-quinolinolato)aluminum (hereafter abbreviated as Alq), tris[1-phenylisoquinoline-C2,N]iridium(III) (hereafter abbreviated as Ir(piq)$_3$), and bis[2-(2-benzoxazolyl)phenolato]zinc(II) (hereafter abbreviated as ZnPBO).

Examples of materials that can be used as the host material include the hole transport materials and electron transport materials mentioned below.

Dopants are used for purposes such as improving the emission efficiency, or changing the wavelength of the emitted light, and one example of a dopant is the distyrylarylene derivative 4,4'-bis(9-ethyl-3-carbazovinylene)-1,1'-biphenyl (hereafter abbreviated as BcZVBi).

In the present embodiment, the light-emitting layer has a multilayer structure in which the plurality of light-emitting layers 13c, 13d and 13e containing mutually different organic light-emitting materials are stacked directly on top of each other.

The combination of organic light-emitting materials contained within the light-emitting layers 13c, 13d and 13e can be set in accordance with the extracted spectrum required from the organic light-emitting diode 10.

One type of organic light-emitting material typically has a single emission peak. Accordingly, in the present invention, in order to enable the extraction of light across an arbitrary broad wavelength region from visible light to the near infrared region (380 nm to 2,500 nm), the light-emitting layers 13c, 13d and 13e preferably contain different organic light-emitting materials having different emission peaks. For example, if a red light-emitting material having an emission peak of 620 to 750 nm, a green light-emitting material having an emission peak of 495 to 570 nm, and a blue light-emitting material having an emission peak of 450 to 495 nm are combined, then the emitted lights merge, enabling white light to be extracted from the transparent substrate 11 side of the organic light-emitting diode 10. Alternatively, white light can also be formed by combining the aforementioned blue light-emitting material and a yellow light-emitting material having an emission peak of 570 to 590 nm.

In this description, a so-called "multilayer system" in which the light-emitting layer is formed by stacking a plurality of layers containing different organic light-emitting materials is described, but the present invention is not limited to this particular system. For example, the light-emitting layer may be composed of a single layer containing a mixture of a plurality of different light-emitting materials. Further, a multiple layer structure formed using a stacking system other than the multilayer system described above may also be used. An example of a stacking system other than the multilayer method is the tandem system.

The multilayer system and the tandem system are both known as light-emitting layer structures for use in white light-emitting diodes used for illumination purposes. For example, the multilayer system is a system in which a plurality of monochromic light-emitting layers (such as a red light-emitting layer, a green light-emitting layer and a blue light-emitting layer) are stacked directly on top of one another. The tandem system is a system in which a plurality of monochromic light-emitting layers are stacked together with intermediate layers disposed therebetween, wherein the intermediate layers are formed from a material having a charge generation capability (for example, see Japanese Unexamined Patent Application, First Publication No. 2010-129301, Japanese Unexamined Patent Application, First Publication No. 2010-192366, Published Japanese Translation No. 2010-527108 of PCT).

In the multilayer system, the plurality of monochromic light-emitting layers are generally positioned in order of the wavelength of emitted light, with the shortest wavelength positioned closest to the anode conductive layer 12. For example, in the case of a 3-layer structure composed of a red light-emitting layer, a green light-emitting layer and a blue light-emitting layer, the blue light-emitting layer is positioned closest to the anode conductive layer 12, and the red light-emitting layer is positioned farthest from the anode conductive layer 12. However, the stacking order of the light-emitting layers may be altered in consideration of the charge balance.

When a color conversion layer which converts the wavelength of the light is provided between the anode conductive layer 12 and the transparent substrate 11, the organic light-emitting material within the light-emitting layers 13c, 13d and 13e may be a single type of material. Further, the light-emitting layers 13c, 13d and 13e may be formed as a single layer.

As the color conversion layer, a material which converts the incident light to light of a longer wavelength (for example, a layer which converts blue light to green light, or a layer which converts green light to red light) is typically used.

For example, if the light-emitting layers 13c, 13d and 13e are formed as a single blue light-emitting layer, then by sequentially stacking a color conversion layer which converts blue light to green light and a color conversion layer which converts green light to red light on the anode conductive layer 12 on the side of the transparent substrate 11, white light can be extracted from the transparent substrate 11 side of the organic light-emitting diode 10.

Organic materials are generally used for forming the hole injection layer 13a, the hole transport layer 13b, and the electron transport layer 13f.

Examples of the material (hole injection material) used for forming the hole injection layer 13a include 4,4',4''-tris(N,N-2-naphthylphenylamino)triphenylamine (hereafter abbreviated as 2-TNATA).

Examples of the material (hole transport material) used for forming the hole transport layer 13b include aromatic amine compounds such as 4,4'-bis[N-1-naphthyl]-N-phenyl-amino]-biphenyl (hereafter abbreviated as α-NPD), copper phthalocyanine (hereafter abbreviated as CuPc) and N,N'-diphenyl-N,N'-di(m-tolyl)benzidine (hereafter abbreviated as TPD).

Examples of the material (electron transport material) used for forming the electron transport layer 13d include metal complex-based compounds such as the aforementioned Alq, and oxadiazole-based compounds such as 2,5-bis(1-naph-thyl)-1,3,4-oxadiazole (hereafter abbreviated as BND) and 2-(4-tert-butylphenyl)-5-(4-biphenylyl)-1,3,4-oxadiazole (hereafter abbreviated as PBD).

Although the electron injection layer 13e is not essential, providing the electron injection layer 13e between the electron transport layer 13d and the cathode conductive layer 14 enables a reduction in the difference in work function, thereby facilitating the movement of electrons from the cathode conductive layer 14 into the electron transport layer 13d.

However, if a magnesium alloy in which Mg/Ag is within a range from approximately 10/90 to 90/10 is used as the cathode conductive layer 14, then an electron injection effect is obtained even without the provision of the electron injection layer 13e.

Lithium fluoride (LiF) or the like can be used as the material for forming the electron injection layer 13e.

The total thickness of the EL layer 13 is typically from 30 to 500 nm.

[Cathode Conductive Layer 14]

The cathode conductive layer 14 is formed from a metal.

Examples of the metal include Ag, Au, Al, and alloys containing one of these metals as the main component. Here, the term "main component" means that the proportion of Ag, Au or Al within the alloy is at least 70% by mass.

Examples of the metal other than the main component within the alloy include Mg and the like.

Specific examples of the alloy include magnesium alloys in which, for example, Mg/Ag=10/90 to 90/10 (mass ratio).

The thickness of the cathode conductive layer 14 is typically from 50 to 3,000 nm.

In the case of a stacked system, manufacture of the organic light-emitting diode 10 can be performed using the procedure described below.

First, the transparent substrate 11 provided with an uneven structure in which a plurality of convex portions 15a, 15b and 15c having mutually different diameters are arranged randomly in two dimensions on the surface of the substrate is prepared (the substrate preparation step). Next, the anode conductive layer 12, the EL layer 13 (the hole injection layer 13a, the hole transport layer 13b, the light-emitting layer 13c (red), the light-emitting layer 13d (green), the light-emitting layer 13e (blue), the electron transport layer 13f and the electron injection layer 13g), and the cathode conductive layer 14 are stacked sequentially on the uneven structure on the transparent substrate 11 (stacking step). Each of these steps is described below in detail.

<Substrate Preparation Step>

The transparent substrate 11 can be prepared by a dry etching method using, as an etching mask, a particle single layer film formed using a mixture of a plurality of particles having different particle sizes (hereafter also referred to as "the mixed particles").

Dry etching using a particle single layer film as an etching mask is a method in which a particle single layer film is formed on the substrate surface using the principle of the Langmuir Blodgett method (hereafter also referred to as the LB method), and this particle single layer film is then used as an etching mask to perform dry etching of the substrate surface to form an uneven structure. This method is described in detail, for example, in Japanese Unexamined Patent Application, First Publication No. 2009-158478.

In the conventional method, in order to obtain a two-dimensional closest packed lattice in which the spacing between particles has been precisely controlled, particles having a single particle size are used. In other words, in a particle single layer film formed using particles of a single particle size, because the particles are in a closest packed two-dimensional arrangement, when this film is used as an etching mask to perform dry etching of the substrate base plate surface, a highly precise triangular lattice (hexagonal lattice) shaped two-dimensional lattice structure is formed as the uneven structure. It has been considered that because the two-dimensional lattice structure on the surface of the cathode conductive layer formed using a substrate having this type of two-dimensional lattice structure is highly precise, using this type of structure enables surface plasmon diffraction waves to be obtained with high efficiency even in the case of a large surface area, meaning the light extraction efficiency can be improved, and a high-brightness organic light-emitting diode can be obtained. However, organic light-emitting diodes manufactured using conventional methods are optimized so as to improve the extraction efficiency of light of a specific single wavelength, and improving the extraction efficiency for an arbitrary wavelength region such as white light or light of even longer wavelengths (visible light through to near infrared light (380 nm to 2,500 nm)) has proven difficult.

On the other hand, in the present invention, the particle mono layer film is formed using mixed particles. As described above, the uneven structure formed using this particle single layer film has a plurality of convex portions 15a, 15b and 15c having mutually different diameters arranged randomly in two dimensions. Then, by ensuring that the uneven structure satisfies the requirements (A) and (B), the resulting organic light-emitting diode is able to exhibit excellent extraction efficiency for the entire visible light region, or for light of an arbitrary broad region within the range from 380 nm to 2,500 nm.

More specifically, the transparent substrate 11 can be prepared by conducting a step of coating the surface of a base plate (the transparent substrate 11 prior to formation of the uneven structure) with a particle single layer film composed of mixed particles (coating step), and a step of performing dry etching of the base plate using the particle mono layer film as an etching mask (dry etching step).

{Coating Step}

The coating step can be performed by conducting a step of preparing a dispersion containing the mixed particles dispersed in an organic solvent, by mixing a plurality of particles having hydrophobic surfaces and having different particle sizes with an organic solvent (dispersion preparation step), a step of forming a particle single layer film composed of the mixed particles on a liquid surface, by placing a liquid (lower layer liquid) for spreading the mixed particles across the liquid surface in a water tank, dripping the dispersion onto the liquid surface of the lower layer liquid, and then evaporating the organic solvent (particle single layer film formation step), and a step of transferring the particle mono layer film to the base plate (transfer step).

At this time, a hydrophilic liquid is used as the lower layer liquid so that the particles, the surfaces of which are hydrophobic, do not sink beneath the liquid surface. Further, a hydrophobic solvent is selected as the organic solvent so that when the dispersion is spread out, the dispersion spreads across the gas-liquid interface between the air and the lower layer liquid without mixing with the lower layer liquid.

In this description, an example was described in which particles having hydrophobic surfaces were used as the mixed particles, a hydrophobic solvent was selected as the organic solvent, and a hydrophilic liquid was used as the lower layer liquid, but particles having hydrophilic surfaces may be selected as the mixed particles, and then used in combination with a hydrophilic solvent as the organic solvent and a hydrophobic liquid as the lower layer liquid.

[Dispersion Preparation Step]

In the dispersion preparation step, three types of particles A, B and C having hydrophobic surfaces and having mutually different particles sizes are prepared (wherein the particle sizes are such that particle A>particle B>particle C), and these particles A, B and C are then dispersed in an organic solvent having high volatility and high hydrophobicity (such as chloroform, methanol, ethanol, methyl ethyl ketone, methyl isobutyl ketone or hexane) to prepare a dispersion.

The three types of particles A, B and C are selected with due consideration of the requirements (A) and (B).

For example, the particle sizes of the three types of particles A, B and C used correspond with the diameters of the convex portions 15a, 15b and 15c respectively, and by appropriate selection of these particle sizes and the dry etching conditions used in the subsequent dry etching step, the diameter, height and shape of the formed convex portions 15a, 15b and 15c, and the distance between the centers of adjacent convex portions can be adjusted. In the present invention, because mixed particles are used, fluctuations occur in the diameter and the distance between the centers of the plurality of convex portions within the uneven structure. Compared with the case in which no such fluctuations exist, the existence of these fluctuations broadens the range for the absolute value |k| of the wave number across which the spectral intensity has a finite value in the requirement (B).

The range for the absolute value |k| of the wave number across which the spectral intensity has a finite value in the requirement (B) can be adjusted by altering factors such as the degree of fluctuation in the diameter and the distance between centers of the plurality of convex portions within the uneven structure, the respective particle size distributions and average particle sizes of the three types of particles A, B and C, and the mixing ratio of A, B and C.

The particle sizes of the particles A, B and C are each preferably within a range from at least 10 nm to not more than 2,000 nm, and more preferably within a range from at least 50 nm to not more than 1,700 nm.

The coefficient of variation of the particle size of each of the particles A, B and C is preferably from 0 to 20%, and more preferably from 0 to 10%.

The difference in the average particle sizes of the particles A, B and C is preferably at least 50 nm, and more preferably 100 nm or greater.

The particle size of a particle describes the primary particle size. The particle size and the coefficient of variation for the particle size can be determined by normal methods from the peak obtained by fitting the particle size distribution determined using the dynamic light scattering method to a Gaussian curve.

Here, an example was described in which particles having three different particle sizes were used, but the present invention is not limited to this particular case, and any two or more types of particles having different particle sizes may be used. For example, particles having 2 to 40 different particle sizes may be used.

From the viewpoint of equalizing the extraction efficiency improvement effect across a broad range, a large number of types of particles are preferable.

When a mixture containing a large variety of particle sizes is used, it is preferable that the coefficient of variation for each of the particle sizes is from 0 to 20%.

The main effect of the present invention can also be achieved using a single type of particle, provided the particle size distribution is broad. When a particle mask is formed using a single type of particle, the coefficient of variation of the particle size may be within a range from 20 to 400%.

The main effect of the present invention can also be achieved by forming a particle mask using a combination of particles for which the coefficient of variation of the particle size is from 0 to 20%, and particles for which the coefficient of variation is from 20 to 400%.

There are no particular limitations on the materials of the particles A, B and C, and examples include metals such as Al, Au, Ti, Pt, Ag, Cu, Cr, Fe, Ni and Si, metal oxides such as $SiO_2$, $Al_2O_3$, $TiO_2$, MgO and CaO, organic polymers such as polystyrene and poly(methyl methacrylate), other semiconductor materials, and inorganic polymers. One of these materials may be used alone, or a combination of 2 or more materials may be used.

By appropriate selection of the materials of these particles A, B and C, and the dry etching conditions described below, the heights and shapes of the formed convex portions 15a, 15b and 15c, namely the depths and shapes of the concave portions 16a, 16b and 16c, can be adjusted.

When water is used as the lower layer liquid, the particles A, B and C (hereafter referred to as simply "the particles") preferably have hydrophobic surfaces. If the surfaces of the particles are hydrophobic, then when the dispersion of the particles is spread out over the liquid surface of the lower layer liquid in the water tank (trough) to form the particle mono layer film in the manner described above, a particle single layer film can be formed easily using water as the lower layer liquid, and the formed particle single layer film can be transferred easily to the substrate surface.

Of the particles mentioned above, organic polymer particles of polystyrene or the like have hydrophobic surfaces and can therefore be used without further modification, but in the case of metal particles or metal oxide particles, the surfaces must be converted to a hydrophobic state using a hydrophobizing agent prior to use.

Examples of the hydrophobizing agent include surfactants and alkoxysilanes.

A method using a surfactant as a hydrophobizing agent is effective in hydrophobizing a wide variety of materials, and is ideal when the particles are composed of metals or metal oxides or the like.

Examples of surfactants which can be used favorably include cationic surfactants such as hexadecyltrimethylammonium bromide and decyltrimethylammonium bromide, and anionic surfactants such as sodium dodecyl sulfate and sodium 4-octylbenzenesulfonate. Further, alkane thiols, disulfide compounds, tetradecanoic acid and octadecanoic acid and the like can also be used.

The hydrophobization treatment using this type of surfactant may be performed in a liquid by dispersing the particles in a liquid such as an organic solvent or water, or may be performed on the particles in a dry state.

When the treatment is performed in a liquid, the particles that are the target of the hydrophobization are added to and dispersed in a volatile organic solvent containing one or more solvents such as chloroform, methanol, ethanol, isopropanol, acetone, methyl ethyl ketone, ethyl ethyl ketone, toluene, n-hexane, cyclohexane, ethyl acetate or butyl acetate, the surfactant is then added, and further mixing and dispersion is performed. When the particles are first dispersed, and the surfactant is then added afterward in this manner, the surfaces of the particles can be more uniformly hydrophobized. The dispersion obtained following this type of hydrophobization treatment may be used, without further modification, as the dispersion that is dripped onto the liquid surface of the lower layer water.

When the particles that are the target of the hydrophobization are in a water dispersion state, another method which is effective involves adding the surfactant to the water dispersion and performing the hydrophobization treatment of the particle surfaces in the water phase, and then adding an organic solvent and extracting the oil phase containing the particles that have completed the hydrophobization treatment. The dispersion obtained in this manner (namely, the dispersion containing particles dispersed within the organic solvent) may be used, without further modification, as the dispersion that is dripped onto the liquid surface of the lower layer water.

In order to enhance the particle dispersibility of this type of dispersion, it is preferable to appropriately select the type of organic solvent and the type of surfactant, and then combine the two as appropriate. By using a dispersion having superior particle dispersibility, aggregation of the particles into clusters can be inhibited, and a particle single layer film in which each of the particles is packed tightly in two dimensions can be obtained more readily. For example, when chloroform is selected as the organic solvent, it is preferable to use decyltrimethylammonium bromide as the surfactant. Other examples of preferred combinations include a combination of ethanol and sodium dodecyl sulfate, a combination of methanol and sodium 4-octylbenzenesulfonate, and a combination of methyl ethyl ketone and octadecanoic acid.

The ratio between the particles that are the target of the hydrophobization and the surfactant is preferably such that the mass of the surfactant is within a range from 1/3 to 1/15 of the mass of the particles that are the target of the hydrophobization.

Further, during this hydrophobization treatment, stirring the dispersion during the treatment, or irradiating the dispersion with ultrasonic waves is effective in improving the particle dispersibility.

A method in which an alkoxysilane is used as the hydrophobizing agent is effective for hydrophobizing metal particles such as Si, Fe and Al, or oxide particles such as $SiO_2$, $Al_2O_3$ and $TiO_2$. However, this method is not limited to these particles, and basically, can be applied to any particles having hydroxyl groups or the like at the particle surface.

Examples of the alkoxysilane include monomethyltrimethoxysilane, monomethyltriethoxysilane, dimethyldiethoxysilane, phenyltriethoxysilane, hexyltrimethoxysilane, decyltrimethoxysilane, vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane, 3-ureidopropyltriethoxysilane, 3-chloropropyltrimethoxysilane, 3-mercaptopropylmethyldimethoxysilane, 3-mercaptopropyltrimethoxysilane, and 3-isocyanatopropyltriethoxysilane.

When an alkoxysilane is used as the hydrophobizing agent, the alkoxysilyl groups within the alkoxysilane are hydrolyzed to form silanol groups, and these silanol groups undergo a dehydration condensation with the hydroxyl groups at the particle surfaces to effect the hydrophobization. Accordingly, hydrophobization using an alkoxysilane is preferably performed in water.

When the hydrophobization is performed in water in this manner, it is preferable to also use a dispersant such as a surfactant to stabilize the dispersion state of the particles prior to the hydrophobization. However, the hydrophobization effect of the alkoxysilane can sometimes be reduced depending on the type of dispersant used, and therefore the combination of the dispersant and the alkoxysilane must be selected appropriately.

In a specific example of a method of performing hydrophobization using an alkoxysilane, the particles are first dispersed in water, the resulting dispersion and an alkoxysilane-containing aqueous solution (an aqueous solution containing hydrolysis products of the alkoxysilane) are mixed together, and the mixture is reacted by stirring at a temperature within a range from room temperature to 40° C. for a predetermined period, preferably from 6 to 12 hours. By performing reaction under these types of conditions, the reaction proceeds appropriately, and a dispersion containing satisfactorily hydrophobized particles can be obtained. If the reaction proceeds excessively, silanol groups react together to bind particles together, thereby reducing the particle dispersibility of the dispersion, and the resulting particle single layer film is more likely to have 2 or more layers where particles are partially aggregated together in clusters. On the other hand, if the reaction does not proceed adequately, then the hydrophobization of the particle surfaces will also be inadequate, and the pitch between particles in the obtained particle single layer film tends to increase.

Further, in the case of alkoxysilanes other than amine systems, because the hydrolysis occurs under either acidic or alkaline conditions, the pH of the dispersion must be adjusted to an acidic or alkaline state at the time of reaction. Although there are no particular limitations on the method used for adjusting the pH, a method in which an acetic acid aqueous solution having a concentration of 0.1 to 2.0% by mass is added is preferable, because in addition to promoting the hydrolysis, a silanol group stabilizing effect is also obtained.

The ratio between the particles that are the target of the hydrophobization and the alkoxysilane is preferably such that the mass of the alkoxysilane is within a range from 1/10 to 1/100 of the mass of the particles that are the target of the hydrophobization.

Following reaction for the predetermined period, one or more of the aforementioned volatile organic solvents is added to the dispersion, and the particles that have been hydrophobized in the water are extracted into the oil phase. At this time, the volume of organic solvent added is preferably within a range from 0.3 to 3 times the volume of the dispersion prior to addition of the organic solvent. The dispersion obtained in this manner (namely, the dispersion containing particles dispersed within the organic solvent) may be used, without further modification, as the dispersion that is dripped onto the liquid surface of the lower layer water in the dripping step. In this hydrophobization treatment, stirring or ultrasonic wave irradiation is preferably performed to enhance the particle dispersibility of the dispersion during treatment. By enhancing the particle dispersibility within the dispersion, aggregation of the particles into clusters can be inhibited, and a particle single layer film can be obtained more readily.

[Particle Single Layer Film Formation Step]

In the particle mono layer film formation step, a water tank (trough) is first prepared, and water (hereafter also referred to as the lower layer water) is placed in the water tank (trough) as the lower layer liquid. Subsequently, the aforementioned dispersion is dripped onto the liquid surface of the lower layer water. As a result, the solvent that acts as the dispersion medium causes the particles A, B and C in the dispersion to spread across the liquid surface of the lower layer water. By subsequently volatilizing the solvent, a particle single layer film is formed in which the particles A, B and C are arranged randomly in two dimensions across a single layer.

The particle concentration of the dispersion (the concentration of the combination of the particles A, B and C) is preferably from 1 to 10% by mass.

Further, the dripping rate of the dispersion onto the liquid surface of the lower layer water is preferably within a range from 0.001 to 0.01 ml/second.

When the particle concentration within the dispersion and the dripping rate satisfy these types of ranges, a particle single layer film can be obtained which provides better suppression of tendencies such as partial aggregation of the particles into clusters to form 2 or more layers, and the occurrence of defective regions in which no particles exist.

Formation of the aforementioned particle single layer film occurs by particle self-assembly. The principle of self-assembly is that when particles assemble, surface tension arises due to the dispersion medium that exists between the particles, and as a result, the particles do not exist in a scattered state, but rather automatically form a closely packed single layer structure on the surface of the water. Using a different expression, this type of formation of a closely packed structure due to surface tension can also be referred to as a mutual adsorption between particles in the horizontal direction caused by capillarity.

For example, when three particles assemble and make contact while floating on the surface of water, surface tension acts to minimize the total length of the waterline of the particle group, and the three particles are stabilized in a basic triangular shape (in the case of particles having different particle sizes, an equilateral triangle is not formed). If the waterline were to occur at the peak of the particle group, namely when the particles are sunken beneath the liquid surface, this type of self-assembly would not occur, and a particle single layer film cannot be formed. Accordingly, it is important that when one of the particles and the lower layer water is hydrophobic, the other must be hydrophilic, so that the particle groups do not sink beneath the liquid surface.

As mentioned above, water is preferably used as the lower layer liquid, and when water is used, a comparatively large surface free energy occurs, so that once formed, the closely packed single layer structure of particles can be maintained in a more stable manner on the liquid surface.

[Transfer Step]

In the transfer step, the particle mono layer film formed on the liquid surface of the lower layer water during the particle mono layer film formation step is transferred, as a single layer, to the base plate that functions as the etching target.

There are no particular limitations on the specific method used for transferring the particle mono layer film to the base plate, and examples include a method in which the hydrophobic base plate is held in a substantially parallel state relative to the particle mono layer film, the base plate is then lowered down to make contact with the particle mono layer film from above, and the particle mono layer film is then transferred to the base plate by the affinity between the hydrophobic particle single layer film and the hydrophobic base plate, and a method in which the base plate is placed in a substantially horizontal position in the lower layer water inside the water tank prior to formation of the particle mono layer film, and following formation of the particle mono layer film on the liquid surface, the liquid surface is lowered gradually, thereby transferring the particle mono layer film onto the base plate. By using these methods, the particle mono layer film can be transferred to the base plate without using any special equipment, but in terms of enabling the particle mono layer film to be transferred to the base plate with good maintenance of the closely packed state of the particles even if the particle mono layer film has a large surface area, use of the so-called LB method is preferable.

In the LB method, the base plate is immersed in advance in a substantially vertical direction in the lower layer water inside the water tank, and the aforementioned particle single layer film formation step is performed in this state, thus forming a particle single layer film. Subsequently, following completion of the particle mono layer film formation step, the base plate is lifted upward, thereby transferring the particle mono layer film to the base plate.

At this time, because the particle mono layer film has already been formed in a single layer state on the liquid surface by the particle mono layer film formation step, even if the temperature conditions (the temperature of the lower layer water) during the transfer step or the lifting speed of the base plate fluctuate slightly, there is no chance of the particle mono layer film collapsing and forming multiple layers.

The temperature of the lower layer water is usually dependent on the environmental temperature, which fluctuates with the season and the weather, but is typically about 10 to 30° C.

Further, in this case, if an LB trough apparatus equipped with a surface pressure sensor for measuring the surface pressure of the particle mono layer film by the Wilhelmy method, and a moveable barrier able to compress the particle mono layer film along the direction of the liquid surface is used as the water tank, then particle single layer films having large surface areas can be transferred to the base plate in a more stable manner. With this type of apparatus, the particle mono layer film can be compressed to obtain a favorable diffusion pressure (packing density) while the surface pressure of the particle mono layer film is measured, and the particle mono layer film can also be moved toward the base plate at a constant rate. As a result, the transfer of the particle mono layer film from the liquid surface to the base plate occurs smoothly, and problems such as an inability to transfer particle single layer films having anything but a small surface area can be avoided.

The diffusion pressure is preferably within a range from 5 to 80 mNm$^{-1}$, and is more preferably from 10 to 40 mNm$^{-1}$. With this type of diffusion pressure, a closely packed particle single layer film with no gaps between particles can be obtained more easily. Further, the lifting speed of the base plate is preferably from 0.5 to 20 mm/minute.

By performing the above transfer step, the surface of the base plate can be coated with the particle mono layer film.

Following the transfer step, an additional fixing step for securing the particle mono layer film to the base plate may be performed if necessary. By securing the particle mono layer film to the base plate, the possibility of the particles moving across the surface of the base plate during the subsequent dry etching can be suppressed, meaning the base plate surface can be etched with greater stability and precision. As the dry etching proceeds, the diameter of each particle tends to gradually decrease, and therefore the possibility of the particles moving on the base plate increase.

Examples of the method used for the fixing step include a method which uses a binder, and a sintering method.

In the method which uses a binder, a binder solution is supplied to the particle mono layer film formed on the base plate, and this solution is allowed to permeate through into the spaces between the particle mono layer film and the base plate.

The amount used of the binder is preferably within a range from 0.001 to 0.02 times the mass of the particle mono layer film. Provided the amount satisfies this range, the particles can be secured satisfactorily without the problem arising wherein the amount of the binder is too great, resulting in the binder accumulating between particles, and having an adverse effect on the etching precision. If the binder solution is supplied in an excessive amount, then the excess binder solution may be removed following permeation of the binder solution by using a spin coater or tilting the substrate.

Examples of the types of binder that may be used include the alkoxysilanes mentioned above as examples of the hydrophobizing agent, as well as typical organic binders and inorganic binders and the like, and depending on the type of binder used, an appropriate heat treatment may be performed after permeation of the binder solution. When an alkoxysilane is used as the binder, the heat treatment is preferably performed under conditions including a temperature of 40 to 80° C. and a heating time of 3 to 60 minutes.

When a sintering method is used, the base plate with the particle mono layer film formed thereon is heated, thereby fusing each of the particles that constitute the particle mono layer film to the base plate. The heating temperature may be determined in accordance with the material of the particles and the material of the base plate, but in the case of particles having a particle size of 1 μm or less, an interface reaction begins at a temperature lower than the actual melting point of the substance, and therefore the sintering is complete at a comparatively lower temperature. If the heating temperature is too high, then the fusion surface area of the particles becomes too great, which can effect the precision of the film, for example by changing the shape of the particle mono layer film. Further, if the heating is performed in air, then there is a possibility that the base plate and the various particles may oxidize, and therefore the heating is preferably performed under an inert gas atmosphere. If the sintering is performed in an atmosphere containing oxygen, then conditions which take account of the resulting oxide layer must be set in the subsequent etching step.

{Dry Etching Step}

The transparent substrate 11 can be obtained by dry etching the surface of the base plate that has been coated with the particle mono layer film in the manner described above.

Specifically, when dry etching is started, the etching gas first passes through the gaps between the particles that constitute the particle mono layer film and reaches the surface of the base plate, and therefore concave portions are formed at those portions, whereas convex portions appear at the positions corresponding with each of the particles. As the dry etching is continued, the particle on each convex portion is also etched and becomes gradually smaller, while the concave portions in the surface of the base plate become deeper. Finally, each of the particles is removed entirely by the etching, leaving an uneven structure formed on the surface of the base plate.

At this time, by appropriate adjustment of the dry etching conditions (such as the bias, the gas flow rate, and the type and amount of the deposition gas), the average heights and the shapes of the formed convex portions 15a, 15b and 15c can be adjusted.

Examples of the etching gas used in the dry etching include Ar, $SF_6$, $F_2$, $CF_4$, $C_4F_8$, $C_5F_8$, $C_2F_6$, $C_3F_6$, $C_4F_6$, $CHF_3$, $CH_2F_2$, $CH_3F$, $C_3F_8$, $Cl_2$, $CCl_4$, $SiCl_4$, $BCl_2$, $BCl_3$, $BC_2$, $Br_2$, $Br_3$, HBr, $CBrF_3$, HCl, $CH_4$, $NH_3$, $O_2$, $H_2$, $N_2$, CO and $CO_2$, but this is not an exhaustive list, and other compounds may be used provided they do not impair the effects of the present invention. One or more of these gases may be used in accordance with factors such as the particles that constitute the particle mono layer film and the material of the base plate.

Examples of etching apparatus which can be used include any apparatus capable of anisotropic etching and capable of generating an electric field with a minimum bias of approximately 20 W, such as a reactive ion etching apparatus and an ion beam etching apparatus. There are no particular limitations on the method used for generating the plasma, the structure of the electrodes, the structure of the chamber, or on specifications such as the frequency of the high-frequency power source.

In the present invention, the various etching conditions (such as the material of the particles that constitute the particle mono layer film, the material of the base plate, the type of etching gas used, the bias power, the antenna power, the gas flow rate and pressure, and the etching time) are preferably set such that the etching selectivity ratio (etching rate of substrate/etching rate of particle single layer film) in the dry etching step is within a range from 0.01 to 1.0.

For example, when colloidal silica particles are selected as the particles that constitute the particle mono layer film etching mask, and a quartz plate is selected as the base plate for use in combination with the particles, by using a gas such as Ar or $CF_4$ as the etching gas, etching can be performed such that the ratio between the height of the convex portions and the distance between convex portions is comparatively low.

Further, by setting the bias of the electric field to a value within a range from several tens of W to several hundred W, the positively charged particles within the plasma-state etching gas are accelerated and impact the base plate at high speed in a substantially perpendicular manner. Accordingly, when a gas which has reactivity relative to the base plate is used, the reaction rate of physical-chemical etching in the perpendicular direction can be increased.

In dry etching, although dependent on the particular combination of the material of the base plate and the type of etching gas, isotropic etching by radicals generated by the plasma tends to occur in parallel. This etching by radicals is chemical etching, and the etching occurs isotropically in all directions of the etching target. Because radicals have no charge, the etching rate cannot be controlled by the bias power setting, but can be manipulated by the concentration of the etching gas inside the chamber. In order to achieve anisotropic etching with charged particles, a certain gas pressure must be maintained, and therefore as long as a reactive gas is used, the effects of radicals cannot be reduced to zero. However, a technique in which the radical reaction rate is slowed by cooling the base plate is widely used, and because apparatus fitted with this type of mechanism are common, use of such cooling is preferable.

Further, in the dry etching step, by mainly adjusting the bias power, and altering the so-called deposition gas in accordance with the conditions, a two-dimensional lattice structure can be formed on the base plate surface in which the ratio between the diameter of the bottom surface of the convex portions and the height of the convex portions (convex portion bottom surface diameter/height) is comparatively low.

<Stacking Step>

By stacking the anode conductive layer 12, the EL layer 13 (the hole injection layer 13a, the hole transport layer 13b, the light-emitting layer 13c, the light-emitting layer 13d, the light-emitting layer 13e, the electron transport layer 13f and the electron injection layer 13g), and the cathode conductive layer 14 in that order on top of the uneven structure of the transparent substrate 11 prepared in the manner described above, the light-emitting diode 10 can be obtained.

The light-emitting layers 13c, 13d and 13e are monochromic light-emitting layers each containing a different organic light-emitting material, and in the present embodiment, the light-emitting layer 13c is a red light-emitting layer, the light-emitting layer 13d is a green light-emitting layer, and the light-emitting layer 13e is a blue light-emitting layer.

In this manner, when the light-emitting layer is formed with a multilayer structure by stacking a plurality of monochromatic light-emitting layers each containing a different light-emitting material, it is preferable that the plurality of monochromatic light-emitting layers are stacked in order of wavelength, with the layer which emits light of the shortest wavelength formed closest to the anode conductive layer 12.

However, the present invention is not limited to this configuration. For example, the stacking order of the red light-emitting layer, the green light-emitting layer and the blue light-emitting layer is not limited to the order described above, and stacking may be performed in an order that best matches the properties of each light-emitting layer. Further, the light-emitting layer may also have a two-layer structure which combines a blue light-emitting layer and a yellow light-emitting layer.

The light-emitting layer may also be a single layer containing a mixture of a plurality of light-emitting materials.

When the light-emitting layer has a multilayer structure, the stacking system is not limited to the multilayer system described above in which the layers are stacked directly on top of one another, and other stacking systems may also be used. For example a tandem system may be used in which after forming a single monochromatic light-emitting layer, an intermediate layer is formed before stacking the next monochromatic light-emitting layer.

There are no particular limitations on the stacking method used for stacking each of these layers, and conventional methods used in the manufacture of typical organic light-emitting diodes can be used. For example, the anode conductive layer 12 and the cathode conductive layer 14 may each be formed by a sputtering method or a vacuum deposition method or the like. Further, each layer of the EL layer 13 is formed by a vacuum deposition method.

Because the anode conductive layer 12 and the EL layer 13 are extremely thin, by stacking each layer sequentially in the manner described above, the uneven structure on the surface of the transparent substrate 11 is reproduced on each layer. As a result, the cathode conductive layer 14 stacked on top of the EL layer 13 adopts an inverted truncated cone uneven structure having a shape that represents an inversion of the aforementioned truncated cone uneven structure on the surface facing the EL layer 13.

The method of manufacturing an organic light-emitting diode according to the first aspect of the present invention has been described above using the first embodiment, but the present invention is not limited to this particular embodiment.

For example, the first embodiment described the case in which the shapes of the convex portions 15a, 15b and 15c were truncated cone shapes, but the present invention is not limited to this configuration, and for example, circular cylindrical shapes, cone shapes, sinusoidal shapes, or other derived shapes based on these shapes may also be used.

In the first embodiment, in the substrate preparation step, the transparent substrate 11 was prepared by coating the surface of the base plate with the particle mono layer film, and using the particle mono layer film as an etching mask to perform dry etching of the base plate, but it is also possible to first form a substrate provided with an uneven structure in which a plurality of convex portions 15a, 15b and 15c having mutually different diameters are arranged randomly in two dimensions on the substrate surface, and then use this substrate as a template for preparing the transparent substrate 11.

For example, if the structure on the template surface is transferred an even number of times to other base plates, then a transparent substrate is obtained which has an uneven structure in which a plurality of convex portions 15a, 15b and 15c having mutually different diameters are arranged randomly in two dimensions on the substrate surface.

Further, if the structure on the template surface is transferred an odd number of times to other base plates, then a transparent substrate is obtained which has an uneven structure in which a plurality of concave portions having mutually different diameters are arranged randomly in two dimensions on the substrate surface. This uneven structure on the surface of the transparent substrate has a shape that represents an inversion of the uneven structure on the template surface.

Transfer of the structure on the template surface can be performed using a method such as the nanoimprint method, hot press method, injection molding method or UV embossing method disclosed in Japanese Unexamined Patent Application, First Publication No. 2009-158478.

As the number of transfer repetitions increases, the shape of the fine unevenness tends to become blunted, and therefore a practically applicable number of transfer repetitions is preferably from 1 to 4.

Furthermore, in the first embodiment, an example was described in which the EL layer 13 was composed of 7 layers, namely the hole injection layer 13a, the hole transport layer 13b, the light-emitting layers 13c, 13d and 13e, the electron transport layer 13f, and the electron injection layer 13g, but the present invention is not limited to this configuration, and for example, the functions of two or more layers among the hole injection layer 13a, the hole transport layer 13b, the light-emitting layers 13c, 13d and 13e, the electron transport layer 13f and the electron injection layer 13g may be combined within a single layer. Further, the layers other than the light-emitting layers 13c, 13d and 13e, such as the hole injection layer 13a, the hole transport layer 13b, the electron transport layer 13f and the electron injection layer 13g may be omitted. In the simplest system, the EL layer 13 is composed of only the light-emitting layers 13c, 13d and 13e.

Further, an example was described in which the electron injection layer 13g was provided, but in those cases where the cathode conductive layer 14 also performs the function of an electron injection layer, the electron injection layer 13g need not be provided. For example, by forming the cathode conductive layer 14 from a magnesium alloy such as Mg/Ag=10/90, an electron injection effect such as that described above is obtained, and therefore the cathode conductive layer 14 combines the function of an electron injection layer.

Further, as described above, the layer structure of the light-emitting layer may be either a multilayer system or a tandem system.

Furthermore, in the first embodiment, an example was described in which the anode conductive layer 12, the EL layer 13 and the cathode conductive layer 14 were stacked in that order on the transparent substrate 11, but stacking may also be performed in the reverse order. In other words, the cathode conductive layer 14, the EL layer 13 and the anode conductive layer 12 may be stacked in order on the transparent substrate 11. In this case, the stacking order for the hole injection layer 13a, the hole transport layer 13b, the light-emitting layers 13c, 13d and 13e, the electron transport layer 13f and the electron injection layer 13g that constitute the EL layer 13 is also reversed.

Further, an example was described in which the cathode conductive layer was formed from only the metal layer of the cathode conductive layer 14, but the cathode conductive layer may also have a multilayer structure prepared by stacking a plurality of layers. When the cathode conductive layer has a multilayer structure, at least one layer must be a metal layer, and the other layer(s) may be formed from a metal, or formed from a conductive material other than a metal. Examples of the conductive material other than a metal include the ITO, IZO, ZnO and ZTO mentioned above as potential materials for forming the anode conductive layer 12.

Further, the light extraction system used in the organic light-emitting diode may employ the bottom emission system illustrated in the first embodiment, in which the light extraction surface is the substrate (transparent substrate 11) side of the device, or may employ a top emission system in which the light extraction surface is the surface on the opposite side of the device from the substrate side (namely, the top surface of the stacked layers).

In the case of a top emission system, the top surface of the stacked layers may be either the cathode conductive layer or the anode conductive layer. However, in either case, in order to transmit the light emitted from the EL layer, the layer must be transparent or semi-transparent. Further, in the case of a top emission system, the substrate is not limited to transparent substrates.

Typical stacking configurations for each of the above light extraction systems are described below.

1) Bottom Emission System [Transparent Substrate as the Light Extraction Surface]:

Transparent substrate (having an uneven structure on the surface on the side of the anode conductive layer)–anode conductive layer (transparent conductive layer)–EL layer {hole injection layer–hole transport layer-light–emitting layer (3 layers of red, green and blue, or blue+yellow, or green+red)–electron transport layer–electron injection layer}–cathode conductive layer (metal layer).

2) Top Emission System [Cathode Conductive Layer as the Light Extraction Surface]

Substrate (having an uneven structure on the surface on the side of the reflective layer)–reflective layer–anode conductive layer (transparent conductive layer)–EL layer {hole injection layer–hole transport layer–light–emitting layer (3 layers of red, green and blue, or blue+yellow, or green+red)–electron transport layer–electron injection layer}–cathode conductive layer A (semi-transparent metal layer)–cathode conductive layer B (transparent conductive layer).

3) Top Emission System [Anode Conductive Layer as the Light Extraction Surface]

Substrate (having an uneven structure on the surface on the side of the cathode conductive layer)–cathode conductive layer (metal layer)–EL layer {electron injection layer–electron transport layer–light-emitting layer (3 layers of red, green and blue, or blue+yellow, or green+red)–hole transport layer-hole injection layer}–anode conductive layer (transparent conductive layer).

Of the above, in the top emission system 2), the reflective layer is provided to ensure that light does not exit from the substrate side of the device, and so that light directed toward the substrate side is reflected toward and extracted from the stacked layer side of the device. The reflective layer is generally formed from a metal. Examples of metals which can be used include aluminum, silver, and various other metals.

The cathode conductive layer A is semi-transparent to enable light to be extracted from the top surface of the stacked layers. The transparency of the cathode conductive layer A is adjusted by altering the thickness of the layer. In order to achieve semi-transparency, the thickness of the cathode conductive layer A is typically approximately 10 to 50 nm. Examples of the metal that constitutes the cathode conductive layer A include the metals mentioned above as examples of the metal that constitutes the cathode conductive layer 14, and the use of a metal selected from among gold, silver and aluminum is preferable. In order to also provide the layer with the functionality of an electron injection layer, magnesium may also be included in an amount of 10% or less.

The cathode conductive layer 13 is provided because the cathode conductive layer A alone is too thin to generate sufficient current. Examples of the transparent conductive material that constitutes the cathode conductive layer B include the ITO, IZO, ZnO and ZTO mentioned above as potential materials for forming the anode conductive layer 12.

=Second Aspect=

The method of manufacturing an organic light-emitting diode according to the second aspect of the present invention includes a substrate preparation step of coating the surface of a base plate with a particle single layer film, dry etching the base plate using the particle mono layer film as an etching mask, thereby preparing a template having an uneven structure in which a plurality of unevenness is arranged in two dimensions on the surface of the template, and then preparing a substrate by transferring the uneven structure on the surface of the template at least once to another base plate, and a deposition step, on the uneven structure that has been transferred to the substrate, at least an anode conductive layer, an EL layer including a light-emitting layer containing an organic light-emitting material, and a cathode conductive layer containing a metal layer, such that the uneven structure is reproduced on the surface of the metal layer on the side of the EL layer, wherein in the substrate preparation step, the particle mono layer film is formed using a mixture of a plurality of particles having different particle sizes, and a template having an uneven structure which satisfies the following requirements (A) and (B) is prepared.

Requirement (A): the average height is at least 15 nm but not more than 150 nm.

Requirement (B): the spectral intensity of the height distribution has a finite value when the absolute value |k| of a wave number satisfies the range denoted by formula (I) shown above, and the integral value of the spectral intensity across the range accounts for 35% or more of the integral value of the spectral intensity across the entire wave number range.

With the exception that, in the substrate preparation step, it is a requirement that a template having the aforementioned uneven structure is first prepared, and the substrate is then prepared by transferring the uneven structure, the manufacturing method of this aspect is the same as the manufacturing method of the first aspect.

More specifically, the substrate can be prepared by performing a step of coating the surface of a base plate (the template prior to formation of the uneven structure) with a particle single layer film composed of mixed particles (coating step), a step of performing dry etching of the base plate using the particle mono layer film as an etching mask, thereby forming an uneven structure that satisfies the above requirements (A) and (B), and obtaining a template (dry etching step), and a step of transferring the uneven structure at least once to a transfer base plate (transfer step).

The coating step in the present aspect can be executed in the same manner as the coating step of the first aspect (namely, dispersion preparation step, particle single layer film formation step, and transfer step).

There are no particular limitations on the base plate used in this step, provided it can be subjected to dry etching. In those cases where coating with the particle mono layer film and the subsequent dry etching are performed directly onto the base plate to prepare the transparent substrate 11, the base plate is limited to transparent materials, but in the present aspect, the base plate need not be transparent.

The dry etching step in this aspect can be performed in the same manner as the dry etching step of the first aspect.

By performing the dry etching step, a template is obtained which has an uneven structure in which a plurality of convex portions is arranged in two dimensions on the surface of the template. Because the particle mono layer film is used as an etching mask, the shape of the convex portions in the uneven structure on the surface of this template is isotropic in relation to the substrate in-plane direction.

The procedure used for determining whether or not the shape of the convex portions is isotropic in relation to the substrate in-plane direction is as described above.

In the transfer step, the transfer of the uneven structure on the template surface to another base plate can be performed using a conventional method such as the nanoimprint method, hot press method, injection molding method or UV embossing method disclosed in Japanese Unexamined Patent Application, First Publication No. 2009-158478.

The base plate to which the uneven structure of the template is transferred (hereafter also referred to as the transfer base plate) may have either a single layer structure or a multilayer structure. For example, the transfer base plate may have a structure in which a transparent resin layer is laminated on the surface of a transparent glass plate. The material and layer configuration of the transfer base plate can be set appropriately in accordance with the transfer method and the like.

When the number of transfer repetitions is one, a base plate corresponding with the target substrate (the substrate prior to transfer of the uneven structure) is used as the transfer base plate. If the number of transfer repetitions is 2 or more, then a base plate corresponding with the target substrate (the substrate prior to transfer of the uneven structure) is used as the transfer base plate for the final transfer, whereas the transfer base plate used prior to the final transfer may be the type of base plate used for the template, or a base plate the same as, or different from, the base plate corresponding with the target substrate.

As the number of transfer repetitions is increased, the shape of the fine unevenness tends to become blunted, and therefore a practically applicable number of transfer repetitions is preferably from 1 to 4.

When the formed uneven structure on the template surface is transferred an even number of times to other base plates, a substrate having an uneven structure with the same shape as that of the uneven structure on the template is obtained. Further, if the formed uneven structure on the template surface is transferred an odd number of times to other base plates, then a substrate having an uneven structure with a shape that represents an inversion of the uneven structure on the template is obtained.

Figure 2:
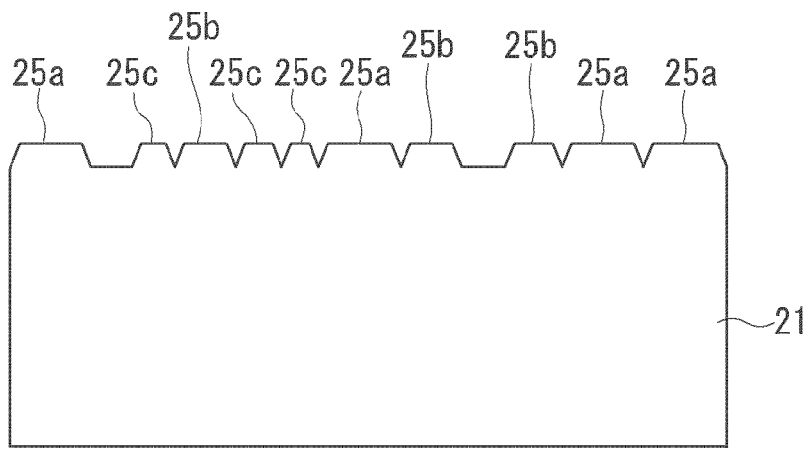
FIG. 2 is a schematic cross sectional view illustrating one example of a template (template 21) prepared using the manufacturing method according to the second aspect of the present invention.

For example, a structure having the same shape as the aforementioned transparent substrate 11 is prepared as the template. In other words, as illustrated in FIG. 2, a template 21 provided with an uneven structure in which a plurality of convex portions 25$a$, 25$b$ and 25$c$ having mutually different diameters are arranged randomly in two dimensions on the surface of the template is prepared. If this uneven structure on the surface of the template 21 is transferred an even number of times to other base plates, then a substrate is obtained which, in the same manner as the template 21, has an uneven structure in which a plurality of convex portions 25$a$, 25$b$ and 25$c$ having mutually different diameters are arranged randomly in two dimensions on the surface. When the anode conductive layer 12, the EL layer 13 (the hole injection layer 13$a$, the hole transport layer 13$b$, the light-emitting layer 13$c$, the light-emitting layer 13$d$, the light-emitting layer 13$e$, the electron transport layer 13$f$ and the electron injection layer 13$g$), and the cathode conductive layer 14 are stacked in that order on the uneven structure on this substrate in the same manner as that described above for the first embodiment of the first aspect, an organic light-emitting diode similar to the organic light-emitting diode 10 illustrated in FIG. 1 is obtained.

Figure 3:
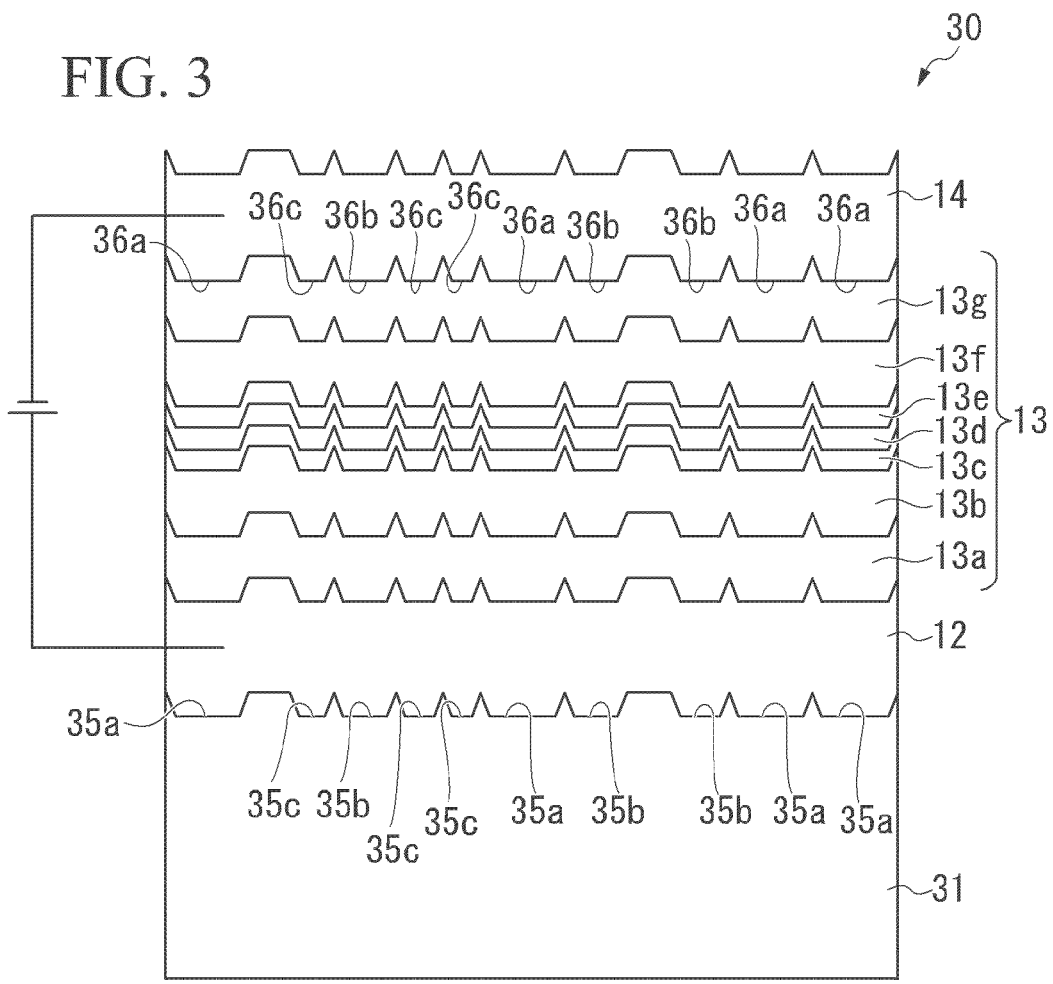
FIG. 3 is a schematic view illustrating one example of the structure of an organic light-emitting diode having a substrate 31 obtained by performing a transfer from the template 21 an odd number of times using the manufacturing method according to the second aspect of the present invention.

On the other hand, if the uneven structure on the surface of the template 21 is transferred an odd number of times to other base plates, then a substrate 31 is obtained which has an uneven structure in which a plurality of concave portions 35$a$, 35$b$ and 35$c$ having mutually different diameters are arranged randomly in two dimensions on the substrate surface. The shapes of the concave portions 35$a$, 35$b$ and 35$c$ represent inversions of the shapes of the convex portions 25$a$, 25$b$ and 25$c$ respectively. When the anode conductive layer 12, the EL layer 13 (the hole injection layer 13$a$, the hole transport layer 13$b$, the light-emitting layer 13$c$, the light-emitting layer 13$d$, the light-emitting layer 13$e$, the electron transport layer 13$f$ and the electron injection layer 13$g$), and the cathode conductive layer 14 are stacked in that order on the uneven structure on the substrate 31 in the same manner as that described above for the first embodiment of the first aspect, an organic light-emitting diode 30 having the configuration illustrated in FIG. 3 is obtained.

In the organic light-emitting diode 30, an uneven structure having a shape that is an inversion of the uneven structure on the surface of the substrate 31, namely an uneven structure in which a plurality of convex portions 36$a$, 36$b$ and 36$c$ having mutually different diameters are arranged randomly in two dimensions, is formed on the surface of the cathode conductive layer 14 on the side of the EL layer 13. The diameters and heights of the convex portions 36$a$, 36$b$ and 36$c$ match the diameters and heights (depths) of the concave portions 35$a$, 35b and 35c respectively. Further, the arrangement pattern of the convex portions 36a, 36b and 36c matches the arrangement pattern of the concave portions 35a, 35b and 35c in the uneven structure on the surface of the substrate 31.

Because the shape of the convex portions in the uneven structure formed on the template surface is isotropic in relation to the substrate in-plane direction, the shape of the convex portions in the uneven structure on the substrate surface formed by transferring the uneven structure an even number of times, and the shape of the concave portions in the uneven structure on the substrate surface formed by transferring the uneven structure formed on the template surface an odd number of times are both isotropic in relation to the substrate in-plane direction.

The procedure used for determining whether or not the shape of the convex portions is isotropic in relation to the substrate in-plane direction is as described above.

In other words, when the substrate surface is observed from a direction perpendicular to the substrate surface (namely, the stacking direction), and attention is focused on a specific convex portion X0, other adjacent convex portions X1, X2, X3 . . . Xn exist in locations which surround the convex portion X0. If the saddle point of the col between X0 and X1 is termed x1, and the saddle points of the cols between X0 and the other convex portions are termed x2, x3 . . . xn, then the cross section of the convex portion X0 is obtained at the height of the highest of these saddle points. The contour of this cross section is termed L0, and a least squares fit circle is drawn for this contour. This circle is defined as the fit circle C0 which indicates the size of the convex portion X0.

The standard deviation of the distance between the contour L0 and the fit circle C0 is determined, and provided that the coefficient of variation obtained by dividing this standard deviation by the radius of the fit circle C0 is 0.3 or less, the shape of the convex portion X0 can be said to be isotropic in relation to the substrate in-plane direction.

When the substrate obtained by the aforementioned transfer step is a substrate formed by transferring the uneven structure of the template surface an even number of times to other base plates, the average height of the convex portions in the uneven structure on the substrate surface and the spectral intensity of the height distribution satisfy the aforementioned requirement (A) and requirement (B) respectively.

When the substrate obtained by the transfer step is a substrate formed by transferring the uneven structure of the template surface an odd number of times to other base plates, the average depth of the concave portions in the uneven structure on the substrate surface and the spectral intensity of the depth distribution satisfy the above requirement (A) and requirement (B) respectively.

The methods used for measuring the average height of the convex portions and the spectral intensity of the height distribution are as described above.

The average depth of the concave portions can be measured in the same manner as that described for measuring the average height of the convex portions 15a, 15b and 15c. The spectral intensity of the depth distribution of the concave portions can be measured in the same manner as the spectral intensity of the height distribution of the convex portions.

As described above, the height of a single convex portion is determined by focusing on a specific convex portion X0, determining the saddle points x1, x2, x3 . . . xn of the cols between the convex portion X0 and other surrounding convex portions, and then calculating the difference in height between the average height of the surrounding saddle points and the height at the center of the convex portion X0.

In an organic light-emitting diode manufactured using the manufacturing method according to the first aspect or second aspect of the present invention described above, the extraction efficiency of light across a broad region can be improved dramatically, and high-intensity light emission can be obtained.

Accordingly the manufacturing method of the first aspect or second aspect of the present invention is useful in the manufacture of organic light-emitting diodes for which the light extraction wavelengths span the entire region from visible light through to the near infrared region (380 nm to 2,500 nm). More specifically, a required wavelength region (for example, the visible light region (380 nm to 780 nm)) can be set within the range from visible light through to the near infrared region, and the light extraction efficiency can then be improved dramatically across this entire wavelength region.

Furthermore, by using the organic light-emitting diode manufactured using the manufacturing method of the first aspect or second aspect of the present invention, a bright image display device or illumination device can be obtained.

<<Organic Light-emitting Diode>>

The organic light-emitting diode according to the third aspect of the present invention has a stacked structure in which at least an anode conductive layer, an EL layer including a light-emitting layer containing an organic light-emitting material, and a cathode conductive layer containing a metal layer are stacked on an uneven structure of a substrate provided with the uneven structure in which a plurality of unevenness is arranged in two dimensions on the surface of the substrate, such that the uneven structure is reproduced on the surface of the metal layer on the side of the EL layer, wherein the uneven structure satisfies the following requirements (A1) and (B1).

Requirement (A1): the average height is at least 15 nm but not more than 150 nm.

Requirement (B1): the spectral intensity of the height distribution has a finite value across the entire range in which the absolute value |k| of a wave number is denoted by formula (I) shown below, and the integral value of the spectral intensity across the range accounts for 35% or more of the integral value of the spectral intensity across the entire wave number range.

[Mathematical Formula 8]

$$\text{Re}\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \leq$$

$$|k| \leq \text{Re}\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right] \quad (I)$$

$\varepsilon_m(\lambda)$ represents the relative dielectric constant of the metal that constitutes the metal layer.

$\varepsilon_d(\lambda)$ represents the equivalent relative dielectric constant of the EL layer.

$\lambda_{max}$ and $\lambda_{min}$ represent the maximum value and the minimum value respectively in a region that includes part or all of the emission spectrum of the organic light-emitting diode, wherein $\lambda_{max} - \lambda_{min} > 200$ nm.

Re[ ] denotes the real part of a complex number.

In the organic light-emitting diode of the present aspect, the substrate provided with an uneven structure (two-dimensional uneven structure) in which a plurality of unevenness is arranged in two dimensions on the surface of the substrate has an uneven structure which satisfies the above requirements (A1) and (B1).

In the organic light-emitting diode of this aspect, by ensuring that the two-dimensional uneven structure on the substrate surface satisfies the above requirements (A1) and (B1), the two-dimensional uneven structure formed on the surface of the metal layer on the side of the EL layer will also satisfy the requirements (A1) and (B1). As a result, the extraction efficiency of light in a region defined by $\lambda_{max}$ and $\lambda_{min}$, which includes part or all of the emission spectrum of this organic light-emitting diode, can be improved dramatically.

Examples of the material for the substrate within the organic light-emitting diode of the present aspect include the same materials as those mentioned above within the description of the manufacturing method of the first aspect.

The description of the above requirement (A1) is the same as the description of the requirement (A) in the aforementioned first aspect.

The description of the requirement (B1) is the same as the description of the requirement (B) in the aforementioned first aspect, with the exception that $\lambda_{max}$ and $\lambda_{min}$ are specified as the maximum value and the minimum value respectively in a region that includes part or all of the emission spectrum of the organic light-emitting diode of the present aspect, wherein $\lambda_{max}-\lambda_{min}>200$ nm.

There are no particular limitations on the shape of the plurality of concave portions or convex portions arranged in two dimensions in the two-dimensional uneven structure on the substrate surface provided that the requirement (A1) and the requirement (B1) are satisfied, but the shape is preferably isotropic in relation to the substrate in-plane direction.

The two-dimensional uneven structure in which concave portions or convex portions of the type of shape described above are arranged in two dimensions can be manufactured with relative ease by a dry etching method using, as an etching mask, the type of particle single layer film formed from mixed particles described above in the first aspect and the second aspect. Further, by appropriate adjustment of the particle sizes of the particles that are mixed together, and the dry etching conditions and the like, the average height (average depth) of the concave portions or convex portions and the height (depth) distribution can be controlled easily, and the target uneven structure can be designed with comparative ease.

In the organic light-emitting diode of the present aspect, the stacked structure provided on top of the uneven structure of the substrate may be any structure formed by stacking at least an anode conductive layer, an EL layer including a light-emitting layer containing an organic light-emitting material, and a cathode conductive layer containing a metal layer, such that the uneven structure is reproduced on the surface of the metal layer on the side of the EL layer, and examples of this stacked structure include the same structures as those mentioned above in the description of the manufacturing method of the first aspect.

<<Image Display Device>>

The image display device according to the fourth aspect of the present invention has an organic light-emitting diode manufactured using the manufacturing method of the aforementioned first aspect or the second aspect in at least a portion of the device.

The illumination device according to the fifth aspect of the present invention has an organic light-emitting diode of the aforementioned third aspect in at least a portion of the device.

There are no particular limitations on the configuration of the image display device of the fourth aspect or fifth aspect, provided it includes an organic light-emitting diode manufactured using the manufacturing according to the first aspect or second aspect, or an organic light-emitting diode according to the third aspect, and for example, a configuration similar to that of a conventional image display device in which the organic light-emitting diode is used as the light source may be used.

<<Illumination Device>>

The illumination device according to the sixth aspect of the present invention has an organic light-emitting diode manufactured using the manufacturing method of the aforementioned first or second aspect in at least a portion of the device.

The illumination device of the seventh aspect of the present invention has an organic light-emitting diode of the aforementioned third aspect in at least a portion of the device.

There are no particular limitations on the configuration of the illumination device of the sixth aspect or seventh aspect, provided it includes an organic light-emitting diode manufactured using the manufacturing according to the first aspect or second aspect, or an organic light-emitting diode according to the third aspect, and for example, a configuration similar to that of a conventional illumination device in which the organic light-emitting diode is used as the light source may be used.

<<Substrate>>

The substrate according to the eighth aspect of the present invention is provided with an uneven structure in which a plurality of concave portions or convex portions are arranged in two dimensions on the surface of the substrate, wherein the uneven structure satisfies the following requirements (A2) and (B2).

Requirement (A2): the average height is at least 15 nm but not more than 150 nm.

Requirement (B2): the spectral intensity of the height distribution has a finite value across the entire range in which the absolute value $|k|$ of a wave number is denoted by formula (II) shown below, and the integral value of the spectral intensity across the range accounts for 35% or more of the integral value of the spectral intensity across the entire wave number range.

[Mathematical Formula 9]

$$k_1 \le |k| \le k_2 \qquad (II)$$

In formula (II), the values of $k_1$ and $k_2$ satisfy formulas (III) and (IV) shown below.

[Mathematical Formula 10]

$$13 \text{ µm}^{-1} < k_1, k_2 < 37 \text{ µm}^{-1} \qquad (III)$$

$$k_2 - k_1 \ge 8 \text{ µm}^{-1} \qquad (IV)$$

The substrate of this aspect is useful in manufacturing the organic light-emitting diode of the third aspect in which the metal that constitutes the metal layer is aluminum and the equivalent relative dielectric constant of the EL layer is 2.89. By stacking at least an anode conductive layer, an EL layer which includes a light-emitting layer containing an organic light-emitting material and has an equivalent relative dielectric constant of 2.89, and a cathode conductive layer containing an aluminum layer on the uneven structure on the substrate surface such that the uneven structure is reproduced on the surface of the aluminum layer on the side of the EL layer, an organic light-emitting diode having excellent light extraction efficiency within the range represented by the aforementioned formula (II) can be obtained.

In the substrate of this aspect, the shape of the concave portions or convex portions is preferably isotropic in relation to the substrate in-plane direction. In this aspect, the definition of whether "the shape of the concave portions or convex portions is isotropic in relation to the substrate in-plane direction" is the same as that described for whether "the shape of the concave portions or convex portions is isotropic in relation to the substrate in-plane direction" in the aforementioned third aspect, and a detailed description is omitted here.

EXAMPLES

Examples of embodiments of the present invention are described below. These examples in no way limit the structure, configuration or system of the target organic light-emitting diode, in which need only utilize the concept of the present invention.

Example 1

A 5.0% by mass aqueous dispersion (dispersed liquid) of a spherical colloidal silica having an average particle size Λ1 of 250.6 nm and a coefficient of variation of the particle size of 3.0%, a 5.0% by mass aqueous dispersion (dispersed liquid) of a spherical colloidal silica having an average particle size Λ2 of 150.1 nm and a coefficient of variation of the particle size of 7.4%, and a 5.0% by mass aqueous dispersion (dispersed liquid) of a spherical colloidal silica having an average particle size Λ3 of 90.2 nm and a coefficient of variation of the particle size of 9.4% were prepared. The average particle size and the coefficient of variation of the particle size were determined from the peak obtained by fitting the particle size distribution, determined by the particle dynamic light scattering method using a Zetasizer Nano-ZS manufactured by Malvern Instruments Ltd., to a Gaussian curve.

These three particle dispersions were each filtered through a membrane filter having a pore diameter of 1.2 μmØ, and following passage through the membrane filter, the three particle dispersions were mixed together. The mixing ratio was adjusted so that the total surface area occupied by each of the particle sizes when all of the particles were deposited on a substrate as a single layer was 1:1:1.

Subsequently, an aqueous solution of a hydrolysis product of phenyltriethoxysilane having a concentration of 1.0% by mass was added to the mixed liquid containing the three particle dispersions, and the resulting liquid was reacted at approximately 40° C. for 3 hours. At this time, the dispersion and the hydrolyzed aqueous solution were mixed in amounts such that the mass of the phenyltriethoxysilane was 0.015 times the total mass of the three types of particles.

Following completion of the reaction, methyl isobutyl ketone of a volume 5 times that of the volume of the dispersion was added to the dispersion and stirred thoroughly, and the hydrophobized colloidal silica was extracted in the oil phase.

The thus obtained hydrophobized colloidal silica dispersion having a concentration of 1.05% by mass was dripped, at a dripping rate of 0.01 ml/second, onto the liquid surface (water was used as the lower layer water, and the water temperature was 23.2° C.) in a water tank (LB trough apparatus) fitted with a surface pressure sensor for measuring the surface pressure of the particle mono layer film, and a moveable barrier able to compress the particle mono layer film along the direction of the liquid surface, and the methyl isobutyl ketone that represents the solvent of the dispersion was then volatilized to form a particle single layer film. A quartz substrate (30 mm×30 mm×1.0 mm, mirror polished on both surfaces) for use as the transparent substrate for an organic light-emitting diode had already been immersed in the lower layer water in the water tank in a substantially vertical direction.

Subsequently, this particle single layer film was compressed by the moveable barrier until a diffusion pressure of 22 to 30 mNm$^{-1}$ was obtained, and the quartz substrate was then lifted up at a rate of 3 mm/minute, thereby transferring the particle mono layer film from the water surface to one surface of the substrate.

A hydrolyzed solution of 0.15% by mass monomethyltrimethoxysilane was used as a binder and allowed to permeate into the quartz substrate having the particle mono layer film formed thereon, and the excess hydrolyzed solution was then removed by treatment with a spin coater (3,000 rpm) for one minute. Subsequently, the binder was reacted by heating at 100° C. for 10 minutes, thus obtaining a quartz substrate having a particle single layer film etching mask formed from colloidal silica.

Subsequently, the thus obtained quartz substrate having a particle single layer film etching mask was subjected to dry etching with $CHF_3$ gas to obtain a quartz substrate having an uneven structure. The etching conditions included an antenna power of 1.500 W, a bias power of 100 W (13.56 MHz), and a gas flow rate of 30 sccm.

Figure 4:
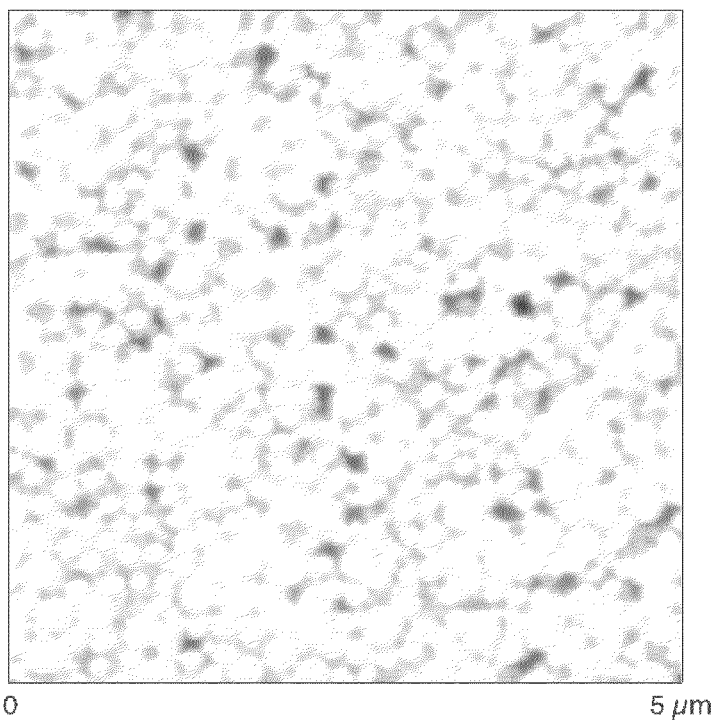
FIG. 4 is an AFM image of the surface of a quartz substrate having an uneven structure prepared in Example 1.

The surface of the obtained quartz substrate having an uneven structure was inspected using an atomic force microscope (AFM). The resulting AFM image is shown in FIG. 4. As illustrated in FIG. 4, three types of convex portions having different diameters were distributed randomly across the surface of the quartz substrate having an uneven structure, and furthermore, the shape of each convex portion was a truncated cone shape. In the image of FIG. 4, the bright portions represent the top surfaces of the convex portions.

When the average heights within this uneven structure were determined by AFM, the average height h1 of the convex portions corresponding with the particles of the average particle size A1, the average height h2 of the convex portions corresponding with the particles of the average particle size A2, and the average height h3 of the convex portions corresponding with the particles of the average particle size A3 were 30.5 nm, 31.1 nm and 29.2 nm respectively.

The average heights h1, h2 and h3 were determined using an AFM. Specifically, an image is obtained for a single region of 5 μm×5 μm selected randomly from within the truncated cone uneven structure. Subsequently, a diagonal line is drawn through the AFM image, and each of the convex portions which intersect the line is classified in terms of diameter and then measured for height. Based on these measured values, an average value is determined for each diameter. These operations are performed in a similar manner for a total of 25 randomly selected regions of 5 μm×5 μm, and the average values for each height is determined for each region. The average values for the 25 regions are themselves averaged, and the resulting values are recorded as the average height of each convex portion.

Figure 5:
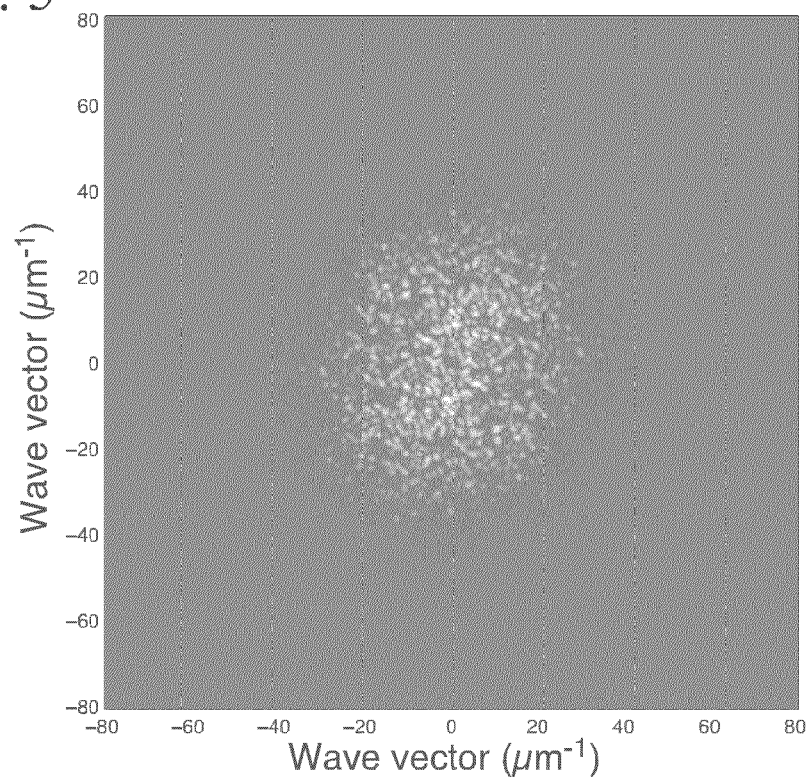
FIG. 5 is a two-dimensional Fourier transform image of the AFM image illustrated in FIG. 4.

Furthermore, a two-dimensional Fourier transformation of the AFM image was performed. The resulting two-dimensional Fourier transform image is illustrated in FIG. 5. In the two-dimensional Fourier transform image, the spectral intensity of the corresponding wave number is indicated by light and shade, wherein a lighter color indicates a stronger intensity, and the black portions lack a finite value.

Figure 6:
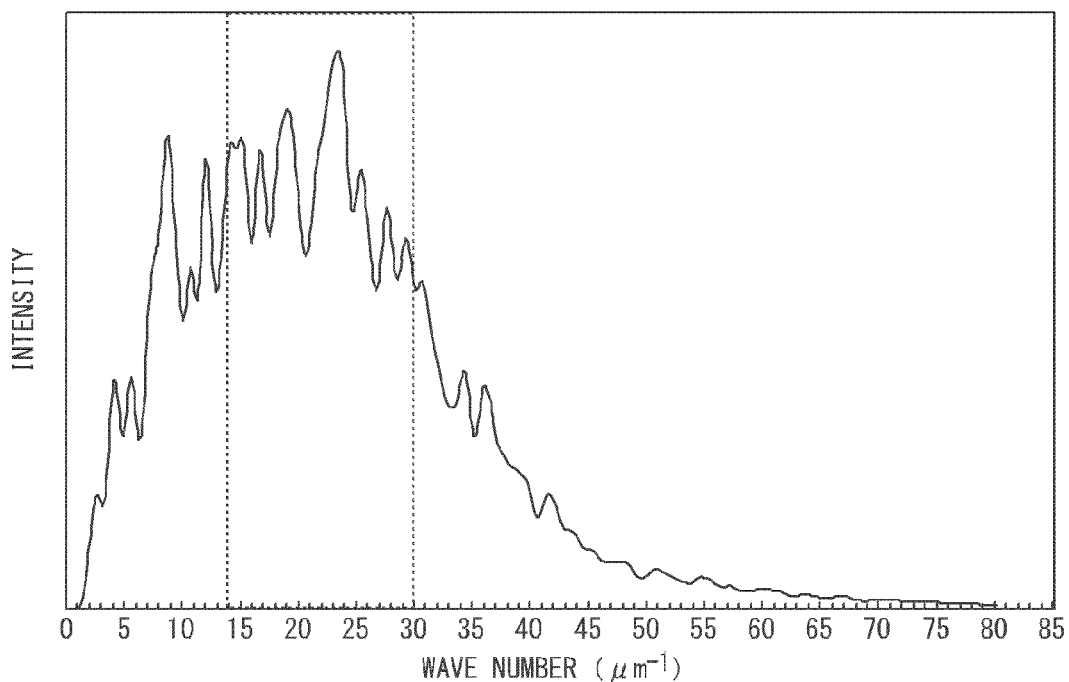
FIG. 6 illustrates the spectral intensity profile of the uneven structure of a quartz substrate having an uneven structure prepared in Example 1.

Moreover, the profile obtained by integrating the intensity at the point where the absolute value of the spectral wave number $|k|=(k_x^2+k_y^2)^{0.5}$ becomes a fixed value (hereafter this profile is called the "spectral intensity profile") are illustrated in FIG. 6. As illustrated in FIG. 6, the portion where the spectral intensity is greatest falls within a range (the range inside the dashed lines shown in FIG. 6) for the surface plasmon wave number of 13.9 μm$^{-1}$ (equivalent to visible light of 780 nm) to 30.2 μm$^{-1}$ (equivalent to visible light of 380 nm), which corresponds with the visible light frequency region, thus indicating that this uneven structure is effective in extracting visible light.

The aforementioned surface plasmon wave number range was calculated in the manner described below.

Relative dielectric constant of Al corresponding with visible light of 780 nm: $\varepsilon_m$=−66.5+46.0i, relative dielectric constant of Al corresponding with visible light of 380 nm: $\varepsilon_m$=−21.1+4.08i, wherein i represents an imaginary unit, and a value of 2.89 was used as the equivalent relative dielectric constant $\varepsilon_d$ of the EL layer.

[Mathematical Formula 11]

$$\text{Re}\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] =$$

$$\text{Re}\left[\frac{2\pi}{0.78} \cdot \sqrt{\frac{(-66.5 + 46.0i) \cdot (2.89)}{(-66.5 + 45.0i) + (2.89)}}\right] =$$

$$13.9(\mu m^{-1})$$

$$\text{Re}\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right] =$$

$$\text{Re}\left[\frac{2\pi}{0.38} \cdot \sqrt{\frac{(-21.1 + 4.08i) \cdot (2.89)}{(-21.1 + 4.08i) + (2.89)}}\right] =$$

$$30.2(\mu m^{-1})$$

Using a sputtering method, an IZO layer having a thickness of 50 nm was deposited as an anode conductive layer on the uneven structure side of the quartz substrate having the uneven structure.

Next, a layer of 2-TNATA having a thickness of 30 nm was deposited by vapor deposition as a hole injection material, thus forming a hole injection layer.

A layer of α-NPD having a thickness of 70 nm was then deposited by vapor deposition as a hole transport material, thus forming a hole transport layer.

Subsequently, a multilayer film having a 3-layer structure was formed as an electron transfer-light-emitting layer using the procedure described below. In other words, a red light-emitting material containing Alq doped with a 1.0% concentration of coumarin C545T was deposited by vapor deposition with a thickness of 5 nm on the hole transport layer, a green light-emitting material containing a conductive material (PH1) doped with a 5.0% concentration of Ir(piq)$_3$ was then deposited by vapor deposition with a thickness of 20 nm, and a blue light-emitting material containing DPVBi doped with a 5.0% concentration of BcZVBi was then deposited by vapor deposition with a thickness of 30 nm.

Subsequently, Alq was deposited by vapor deposition with a thickness of 20 nm as an electron transport material, thus forming an electron transport layer. A layer of LiF having a thickness of 0.6 nm was then deposited by vapor deposition as an electron injection layer.

Finally, a layer of aluminum having a thickness of 150 nm was deposited by vapor deposition to form a cathode conductive layer, thus completing a bottom emission white organic light-emitting diode. By using a shadow mask during deposition, the light emission area was prepared with a size of 2 mm×2 mm.

Example 2

With the exception of using a mixture prepared by mixing a spherical colloidal silica having an average particle size Λ1 of 301.3 nm and a coefficient of variation of the particle size of 3.2%, a spherical colloidal silica having an average particle size Λ2 of 202.5 nm and a coefficient of variation of the particle size of 4.6%, and a spherical colloidal silica having an average particle size Λ3 of 90.2 nm and a coefficient of variation of the particle size of 9.4%, such that the occupied surface area ratio upon spreading the particles on the water surface was 1:1:1, exactly the same operations as Example 1 were used to coat the mixed particles onto the surface of a quartz substrate to prepare a quartz substrate having an uneven structure, and subsequently stack each of the electrode layers and the EL layer on the uneven structure using the same thicknesses and the same materials as Example 1, thus completing preparation of a bottom emission white organic light-emitting diode.

Figure 7:
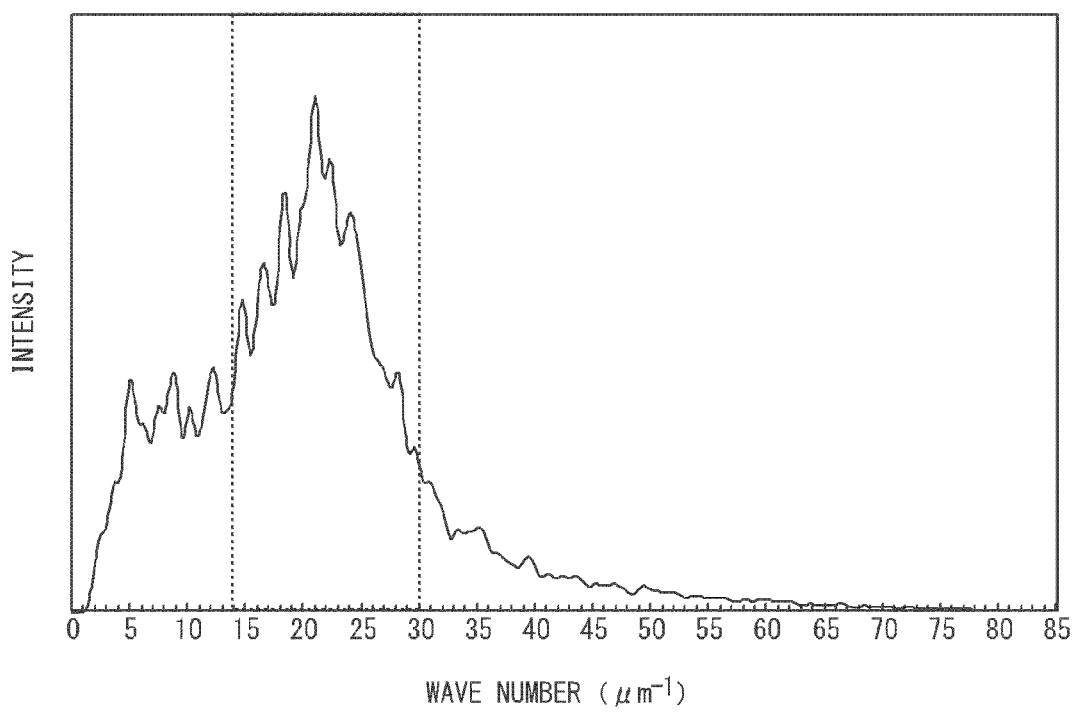
FIG. 7 illustrates the spectral intensity profile of the uneven structure of a quartz substrate having an uneven structure prepared in Example 2.

The spectral intensity profile of the uneven structure on the quartz substrate used in this device is illustrated in FIG. 7.

Example 3

With the exception of using a mixture prepared by mixing a spherical colloidal silica having an average particle size Λ1 of 150.1 nm and a coefficient of variation of the particle size of 7.4%, and a spherical colloidal silica having an average particle size Λ2 of 90.2 nm and a coefficient of variation of the particle size of 9.4%, such that the occupied surface area ratio upon spreading the particles on the water surface was 1:1, exactly the same operations as Example 1 were used to coat the mixed particles onto the surface of a quartz substrate to prepare a quartz substrate having an uneven structure, and subsequently stack each of the electrode layers and the EL layer on the uneven structure using the same thicknesses and the same materials as Example 1, thus completing preparation of a bottom emission white organic light-emitting diode.

Figure 8:
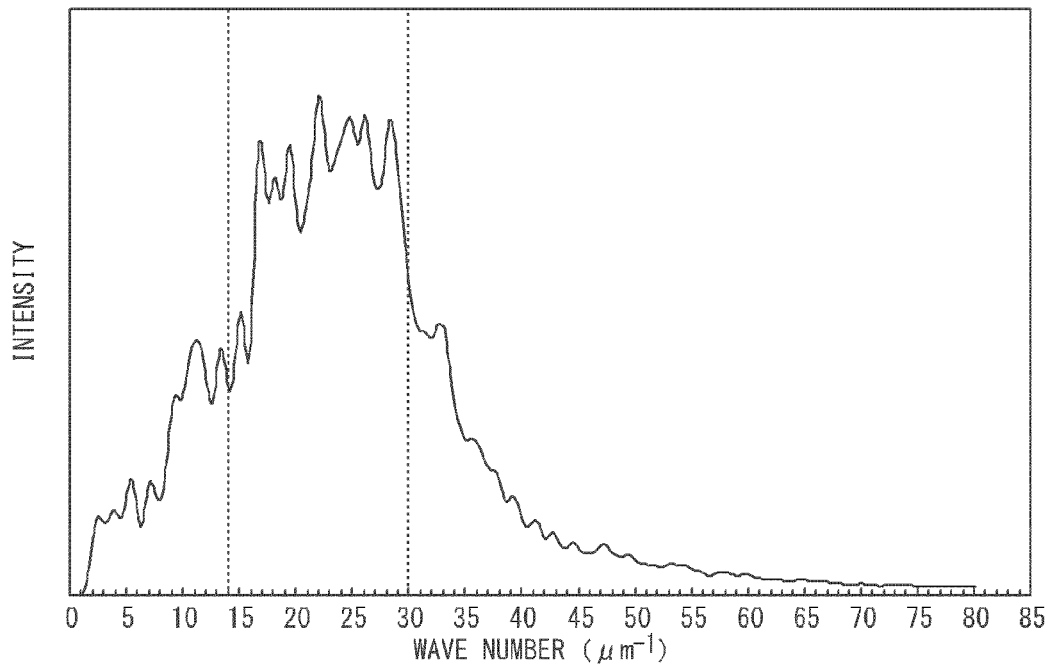
FIG. 8 illustrates the spectral intensity profile of the uneven structure of a quartz substrate having an uneven structure prepared in Example 3.

The spectral intensity profile of the uneven structure on the quartz substrate used in this device is illustrated in FIG. 8.

Example 4

With the exception of using a mixture prepared by mixing a spherical colloidal silica having an average particle size Λ1 of 202.5 nm and a coefficient of variation of the particle size of 4.6%, and a spherical colloidal silica having an average particle size Λ2 of 90.2 nm and a coefficient of variation of the particle size of 9.4%, such that the occupied surface area ratio upon spreading the particles on the water surface was 1:1, exactly the same operations as Example 1 were used to coat the mixed particles onto the surface of a quartz substrate to prepare a quartz substrate having an uneven structure, and subsequently stack each of the electrode layers and the EL layer on the uneven structure using the same thicknesses and the same materials as Example 1, thus completing preparation of a bottom emission white organic light-emitting diode.

Figure 9:
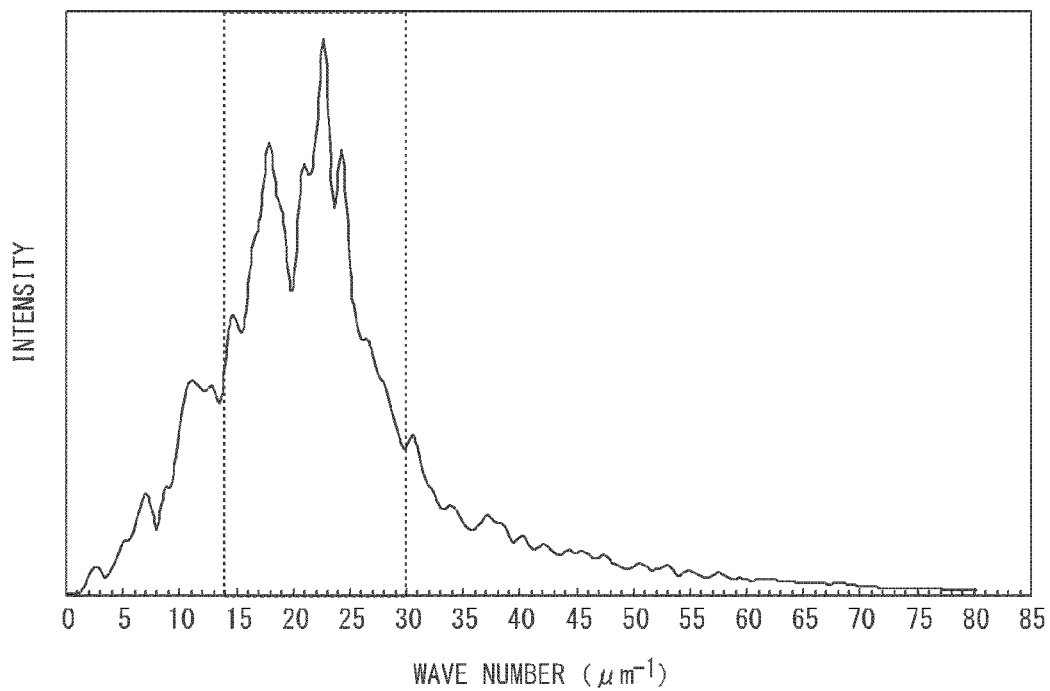
FIG. 9 illustrates the spectral intensity profile of the uneven structure of a quartz substrate having an uneven structure prepared in Example 4.

The spectral intensity profile of the uneven structure on the quartz substrate used in this device is illustrated in FIG. 9.

Example 5

With the exception of using a mixture prepared by mixing a spherical colloidal silica having an average particle size Λ1 of 353.0 nm and a coefficient of variation of the particle size of 3.2%, a spherical colloidal silica having an average particle size Λ2 of 250.6 nm and a coefficient of variation of the particle size of 3.0%, and a spherical colloidal silica having an average particle size Λ3 of 202.5 nm and a coefficient of variation of the particle size of 4.6%, such that the occupied surface area ratio upon spreading the particles on the water surface was 1:1:1, exactly the same operations as Example 1 were used to coat the mixed particles onto the surface of a quartz substrate to prepare a quartz substrate having an uneven structure, and subsequently stack each of the electrode layers and the EL layer on the uneven structure using the same thicknesses and the same materials as Example 1, thus completing preparation of a bottom emission white organic light-emitting diode.

Figure 10:
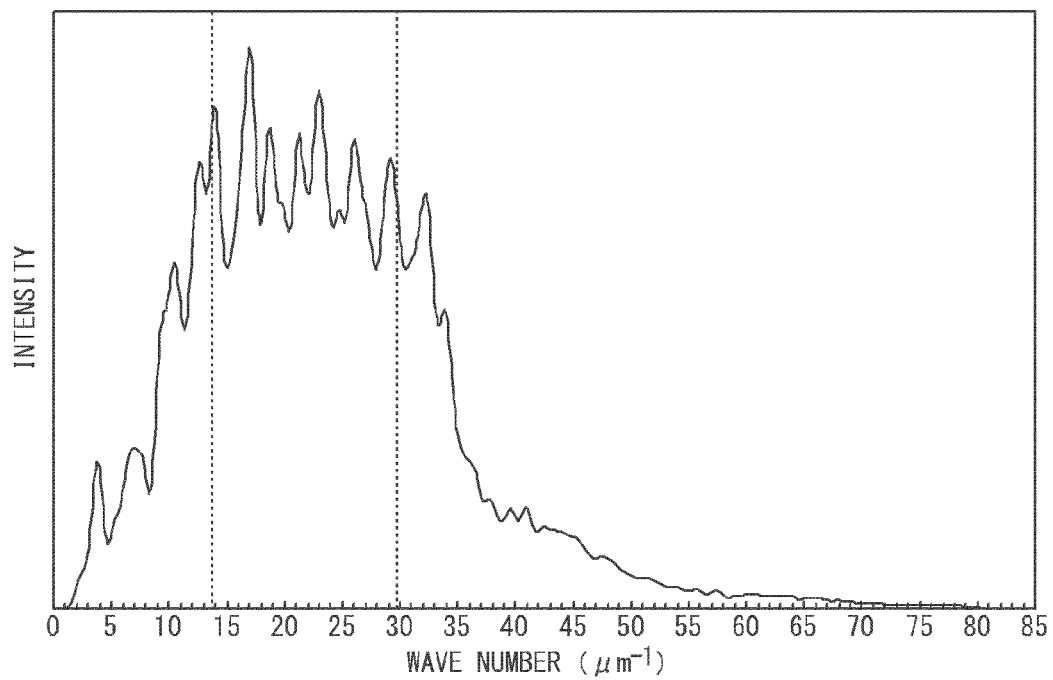
FIG. 10 illustrates the spectral intensity profile of the uneven structure of a quartz substrate having an uneven structure prepared in Example 5.

The spectral intensity profile of the uneven structure on the quartz substrate used in this device is illustrated in FIG. 10.

Example 6

With the exception of using a mixture prepared by mixing a spherical colloidal silica having an average particle size Λ1 of 250.6 nm and a coefficient of variation of the particle size of 3.0%, a spherical colloidal silica having an average particle size Λ2 of 202.5 nm and a coefficient of variation of the particle size of 4.6%, and a spherical colloidal silica having an average particle size Λ3 of 90.2 nm and a coefficient of variation of the particle size of 9.4%, such that the occupied surface area ratio upon spreading the particles on the water surface was 1:1:1, exactly the same operations as Example 1 were used to coat the mixed particles onto the surface of a quartz substrate to prepare a quartz substrate having an uneven structure, and subsequently stack each of the electrode layers and the EL layer on the uneven structure using the same thicknesses and the same materials as Example 1, thus completing preparation of a bottom emission white organic light-emitting diode.

Figure 11:
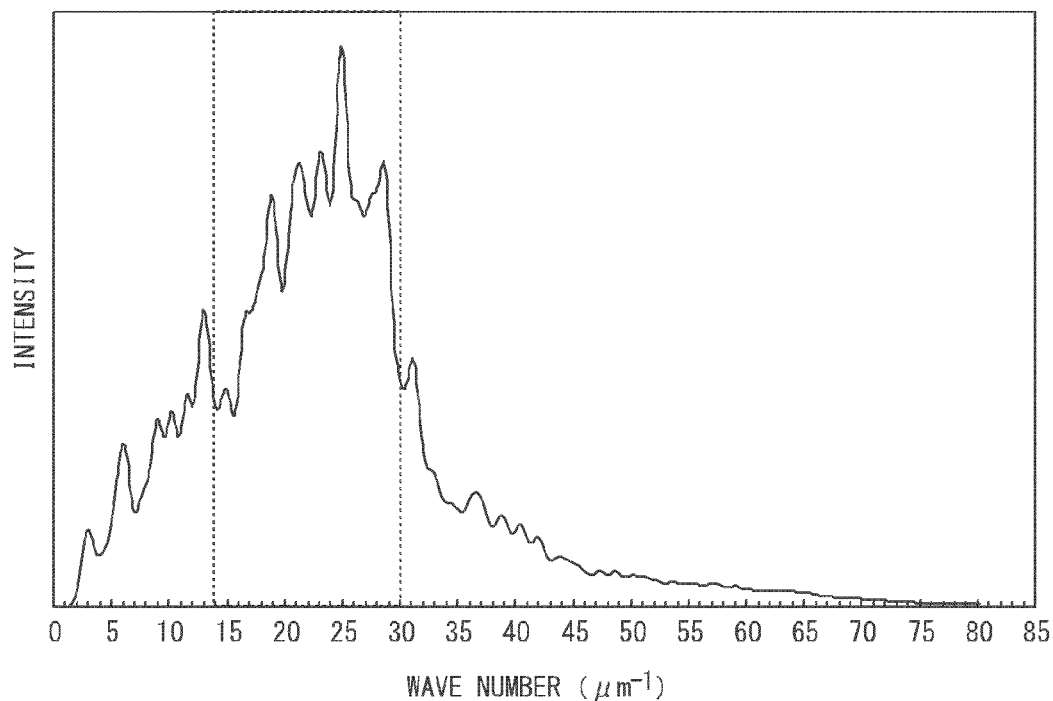
FIG. 11 illustrates the spectral intensity profile of the uneven structure of a quartz substrate having an uneven structure prepared in Example 6.

The spectral intensity profile of the uneven structure on the quartz substrate used in this device is illustrated in FIG. 11.

Example 7

With the exception of using a mixture prepared by mixing a spherical colloidal silica having an average particle size Λ1 of 301.3 nm and a coefficient of variation of the particle size of 3.2%, a spherical colloidal silica having an average particle size Λ2 of 250.6 nm and a coefficient of variation of the particle size of 3.0%, a spherical colloidal silica having an average particle size Λ3 of 202.5 nm and a coefficient of variation of the particle size of 4.6%, and a spherical colloidal silica having an average particle size Λ4 of 90.2 nm and a coefficient of variation of the particle size of 9.4%, such that the occupied surface area ratio upon spreading the particles on the water surface was 1:1:1:1, exactly the same operations as Example 1 were used to coat the mixed particles onto the surface of a quartz substrate to prepare a quartz substrate having an uneven structure, and subsequently stack each of the electrode layers and the EL layer on the uneven structure using the same thicknesses and the same materials as Example 1, thus completing preparation of a bottom emission white organic light-emitting diode.

Figure 12:
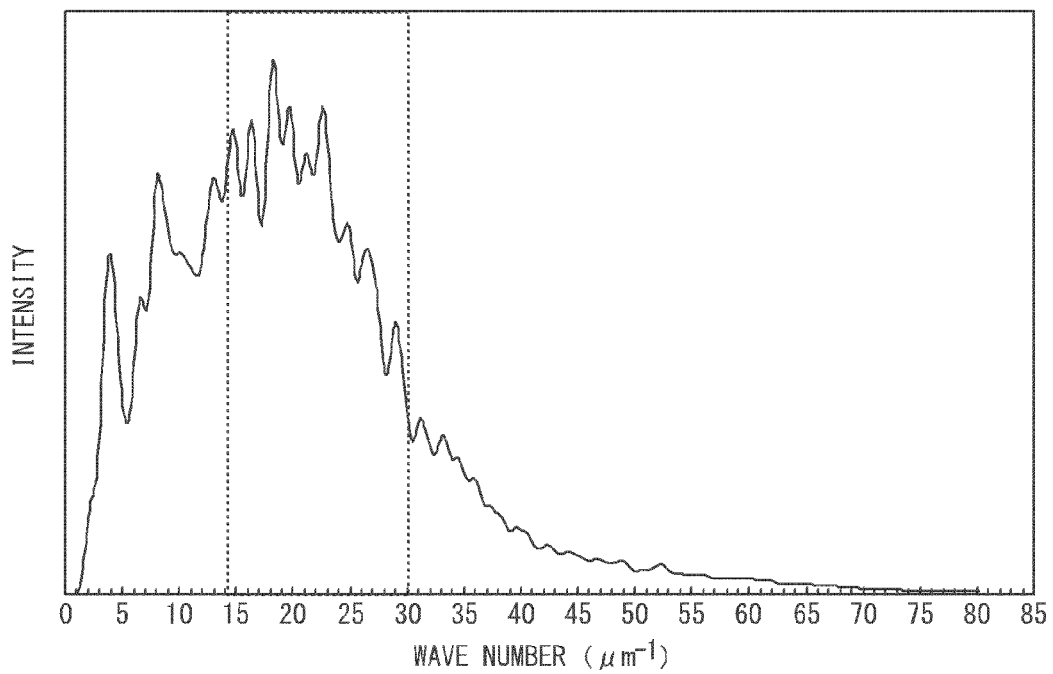
FIG. 12 illustrates the spectral intensity profile of the uneven structure of a quartz substrate having an uneven structure prepared in Example 7.

The spectral intensity profile of the uneven structure on the quartz substrate used in this device is illustrated in FIG. 12.

Example 8

With the exception of using a mixture prepared by mixing a spherical colloidal silica having an average particle size Λ1 of 202.5 nm and a coefficient of variation of the particle size of 4.6%, a spherical colloidal silica having an average particle size Λ2 of 150.1 nm and a coefficient of variation of the particle size of 7.4%, and a spherical colloidal silica having an average particle size Λ3 of 90.2 nm and a coefficient of variation of the particle size of 9.4%, such that the occupied surface area ratio upon spreading the particles on the water surface was 1:1:1, exactly the same operations as Example 1 were used to coat the mixed particles onto the surface of a quartz substrate to prepare a quartz substrate having an uneven structure, and subsequently stack each of the electrode layers and the EL layer on the uneven structure using the same thicknesses and the same materials as Example 1, thus completing preparation of a bottom emission white organic light-emitting diode.

Figure 13:
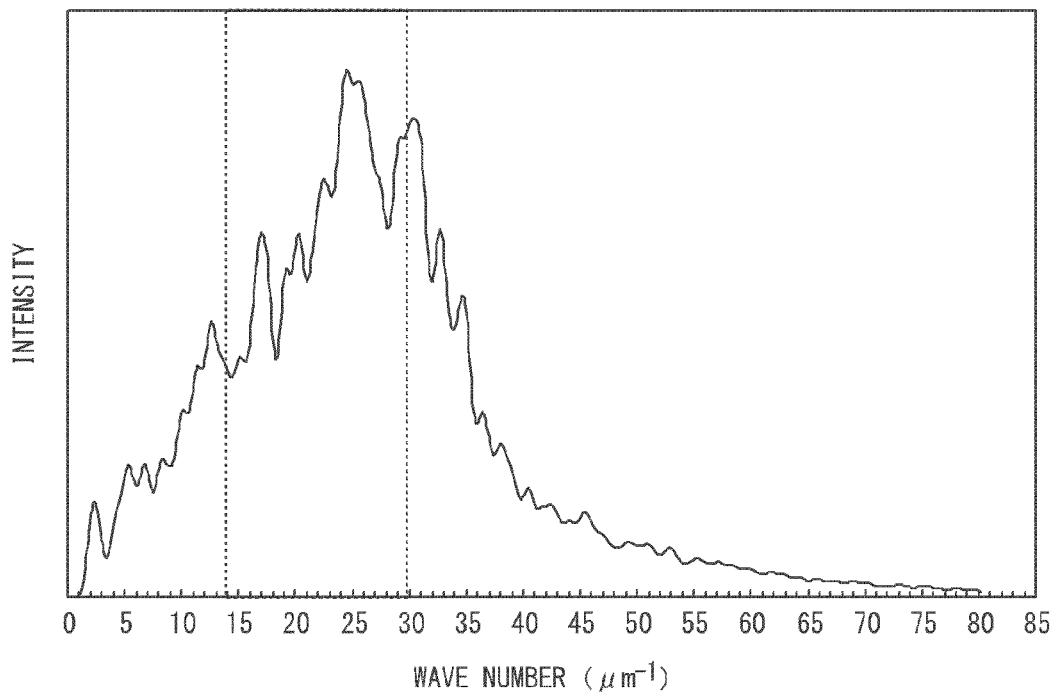
FIG. 13 illustrates the spectral intensity profile of the uneven structure of a quartz substrate having an uneven structure prepared in Example 8.

The spectral intensity profile of the uneven structure on the quartz substrate used in this device is illustrated in FIG. 13.

Example 9

With the exception of using a mixture prepared by mixing a spherical colloidal silica having an average particle size Λ1 of 301.3 nm and a coefficient of variation of the particle size of 3.2%, and a spherical colloidal silica having an average particle size Λ2 of 250.6 nm and a coefficient of variation of the particle size of 3.0%, such that the occupied surface area ratio upon spreading the particles on the water surface was 1:1, exactly the same operations as Example 1 were used to coat the mixed particles onto the surface of a quartz substrate to prepare a quartz substrate having an uneven structure, and subsequently stack each of the electrode layers and the EL layer on the uneven structure using the same thicknesses and the same materials as Example 1, thus completing preparation of a bottom emission white organic light-emitting diode.

Figure 14:
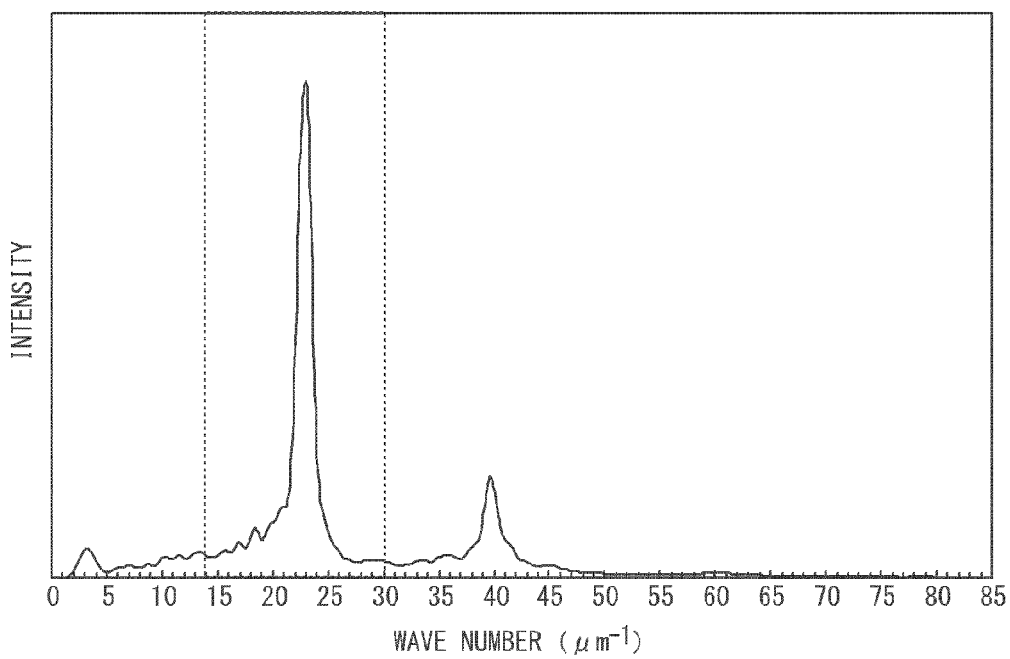
FIG. 14 illustrates the spectral intensity profile of the uneven structure of a quartz substrate having an uneven structure prepared in Example 9.

The spectral intensity profile of the uneven structure on the quartz substrate used in this device is illustrated in FIG. 14.

Comparative Example 1

With the exception of not forming an uneven structure on the surface of the quartz substrate, exactly the same operations as Example 1 were used to stack each of the electrode layers and the EL layer on the substrate using the same thicknesses and the same materials as Example 1, thus completing preparation of a bottom emission white organic light-emitting diode.

Figure 15:
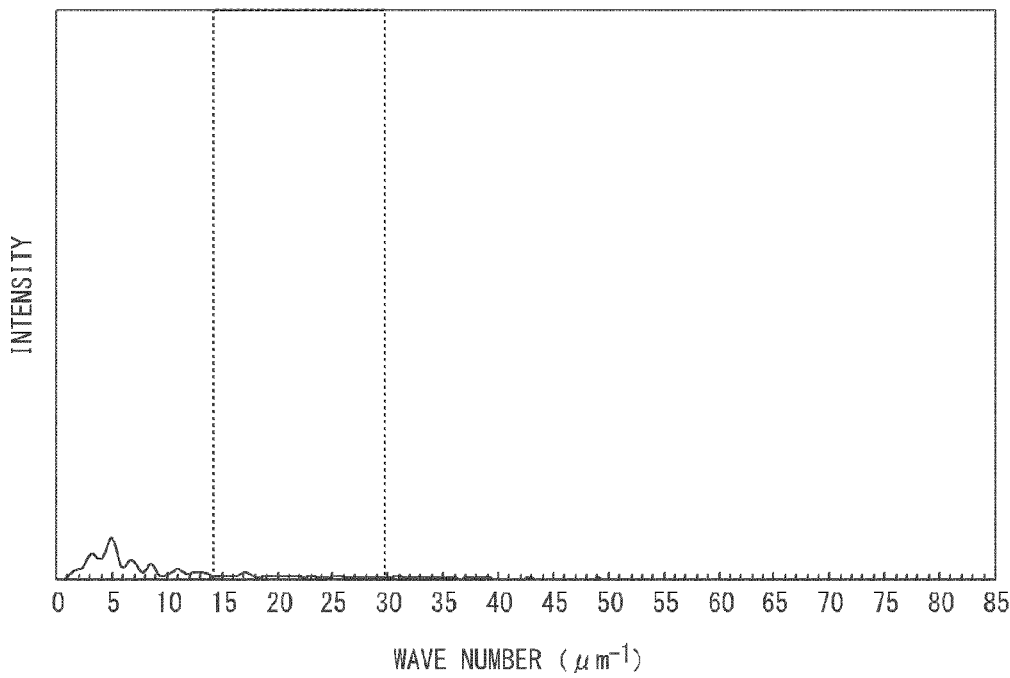
FIG. 15 illustrates the spectral intensity profile of the uneven structure of a quartz substrate used in Comparative Example 1.

The spectral intensity profile of the surface of the quartz substrate (without an uneven structure) used in this device is illustrated in FIG. 15.

Comparative Example 2

With the exception of using a mixture prepared by mixing a spherical colloidal silica having an average particle size Λ1 of 250.6 nm and a coefficient of variation of the particle size of 3.0%, a spherical colloidal silica having an average particle size Λ2 of 202.5 nm and a coefficient of variation of the particle size of 4.6%, and a spherical colloidal silica having an average particle size Λ3 of 150.1 nm and a coefficient of variation of the particle size of 7.4%, such that the occupied surface area ratio upon spreading the particles on the water surface was 1:2:1, exactly the same operations as Example 1 were used to coat the mixed particles onto the surface of a quartz substrate, and subsequently stack each of the electrode layers and the EL layer on the uneven structure using the same thicknesses and the same materials as Example 1, thus completing preparation of a bottom emission white organic light-emitting diode.

Figure 16:
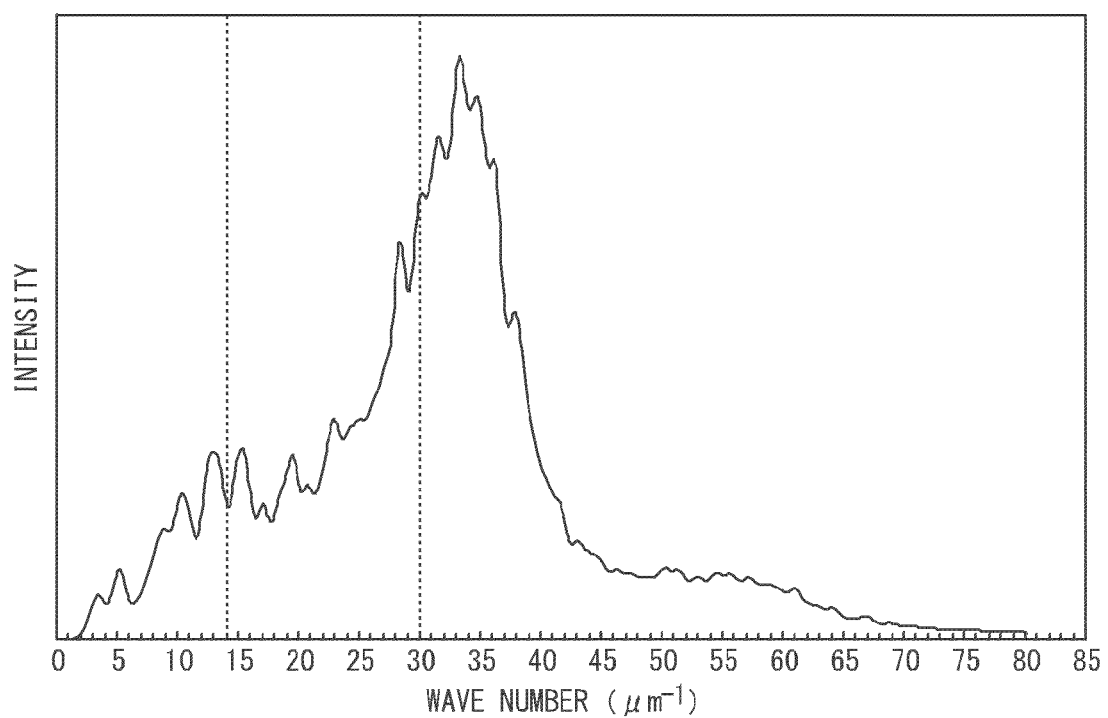
FIG. 16 illustrates the spectral intensity profile of the uneven structure of a quartz substrate having an uneven structure prepared in Comparative Example 2.

The spectral intensity profile of the uneven structure on the quartz substrate used in this device is illustrated in FIG. 16.

[Evaluation of Current Efficiency Characteristics and Power Efficiency Characteristics]

For each of the white organic light-emitting diodes obtained in Examples 1 to 9 and Comparative Example 1 and 2, the current efficiency characteristics and the power efficiency characteristics were evaluated using the procedures described below.

The luminance ($cd/m^2$) in the perpendicular direction when light was emitted from the white organic light-emitting diode at a current density of 12.5 $A/m^2$ was measured using a luminance meter, and the current efficiency relative to the current density (current density ($mA/m^2$)–current efficiency (cd/A)) was determined. Further, the voltage was also measured when the luminance was measured, the luminous flux (lm) was calculated from the luminance, and the power efficiency relative to the current density (current density (mA/m$^2$)–power efficiency (lm/W)) was determined.

Based on these measurement results and using the formula shown below, the rates of improvement in the current efficiency and power efficiency relative to the current density were calculated for the measured values for Examples 1 to 9 and Comparative Examples 1 and 2 relative to the measured values for Comparative Example 1 (a blank).

Rate of Improvement=(Measured Value for Example 1 to 9 or Comparative Example 1 or 2)/Measured Value for Comparative Example 1

[Evaluation of Chromaticity of Light Emission Surface]

Using a spectroscopic color difference meter SE-6000 manufactured by Nippon Denshoku Industries Co., Ltd., the chromaticity of the light emission surface of each of the devices prepared in the examples and the comparative examples was determined as chromaticity coordinates (x, y) in the CIE color system.

The evaluation results for the current efficiency characteristics and the power efficiency characteristics and the evaluation result for the chromaticity of the light emission surface are summarized in Table 1. Further, from the spectral intensity profile of each example, the percentage of the total profile represented by the integral value of the spectral intensity for the uneven structure of the substrate in the visible light region (380 nm to 780 nm) (namely, the percentage (%) of the integral value across the entire spectral intensity wave number range accounted for by the integral value of the spectral intensity across the wave number range from 13.9 μm$^{-1}$ to 30.2 μm$^{-1}$) was determined, and is also shown in Table 1.

For Examples 1 to 9, the rate of improvement in the current efficiency relative to the current density (current density (mA/m$^2$) vs luminance (cd/A)) was from 1.97 times to 3.43 times that of Comparative Example 1, whereas the rate of improvement in the power efficiency relative to the current density (current density (mA/m$^2$) vs emission efficiency (lm/W)) was from 2.11 times to 3.78 times that of Comparative Example 1.

On the other hand, in the spectral intensity profile for the uneven structure of the substrate of Comparative Example 2 (FIG. 16), the major peaks have disappeared from the white light wave number region of 13.9 to 30.2 (μm$^{-1}$), and because only a portion of the white light spectrum was able to be extracted, the extraction efficiency did not improve, and the chromaticity also shifted markedly. This marked shift in the chromaticity means that because a plasmonic lattice can be extracted for only a portion of the wavelength region corresponding with the white light spectrum, the overall color balance is destroyed.

The above results indicated that in the white organic light-emitting diodes obtained in Example 1 to Example 9, the emission intensity increased significantly compared with that of Comparative Example 1 and Comparative Example 2, and the power efficiency and the current efficiency both improved considerably.

TABLE 1

| | MIXING RATIO (0/nm) = RATIO | CHROMATICITY (x, y) | SPECTRAL INTENSITY PROFILE OF SUBSTRATE UNEVEN STRUCTURE | PERCENTAGE OF TOTAL PROFILE REPRESENTED BY THE INTEGRAL VALUE OF THE SPECTRAL INTENSITY FOR SUBSTRATE UNEVEN STRUCTURE IN THE VISIBLE LIGHT REGION (380 nm to nm) (%) |
|---|---|---|---|---|
| EXAMPLE 1 | 250/150/90 = 1:1:1 | 0.34, 0.31 | FIG. 4 | 52.3 |
| EXAMPLE 2 | 300/200/90 = 1:1:1 | 0.35, 0.31 | FIG. 5 | 61.0 |
| EXAMPLE 3 | 150/90 = 1:1 | 0.35, 0.31 | FIG. 6 | 60.0 |
| EXAMPLE 4 | 200/90 = 1:1 | 0.37, 0.33 | FIG. 7 | 65.2 |
| EXAMPLE 5 | 350/250/200 = 1:1:1 | 0.35, 0.33 | FIG. 8 | 56.0 |
| EXAMPLE 6 | 250/200/90 = 1:1:1 | 0.34, 0.31 | FIG. 9 | 61.3 |
| EXAMPLE 7 | 300/250/200/90 = 1:1:1:1 | 0.34, 0.30 | FIG. 10 | 54.0 |
| EXAMPLE 8 | 200/150/90 = 1:1:1 | 0.33, 0.31 | FIG. 11 | 52.7 |
| EXAMPLE 9 | 300/250 = 1:1 | 0.30, 0.45 | FIG. 12 | 63.5 |
| COMPARATIVE EXAMPLE 1 | FLAT SUBSTRATE | 0.33, 0.33 | FIG. 13 | 19.3 |
| COMPARATIVE EXAMPLE 2 | 250/200/150 = 1:2:1 | 0.22, 0.22 | FIG. 14 | 33.5 |

| | CURRENT EFFICIENCY - CURRENT DENSITY CHARACTERISTICS | | POWER EFFICIENCY - CURRENT DENSITY CHARACTERISTICS | |
|---|---|---|---|---|
| | cd/A (@12.5 mA/cm$^2$) | RATE OF IMPROVEMENT RELATIVE TO BLANK (TIMES) | lm/W (@12.5 mA/cm$^2$) | RATE OF IMPROVEMENT RELATIVE TO BLANK (TIMES) |
| EXAMPLE 1 | 1.03 | 3.43 | 0.34 | 3.78 |
| EXAMPLE 2 | 0.98 | 3.27 | 0.33 | 3.67 |
| EXAMPLE 3 | 0.97 | 3.23 | 0.31 | 3.44 |
| EXAMPLE 4 | 0.96 | 3.20 | 0.31 | 3.44 |
| EXAMPLE 5 | 0.80 | 2.67 | 0.26 | 2.89 |
| EXAMPLE 6 | 0.77 | 2.57 | 0.24 | 2.67 |

TABLE 1-continued

| | | | | |
|---|---|---|---|---|
| EXAMPLE 7 | 0.70 | 2.33 | 0.24 | 2.67 |
| EXAMPLE 8 | 0.71 | 2.37 | 0.23 | 2.56 |
| EXAMPLE 9 | 0.59 | 1.97 | 0.19 | 2.11 |
| COMPARATIVE EXAMPLE 1 | 0.30 | 1.00 | 0.09 | 1.00 |
| COMPARATIVE EXAMPLE 2 | 0.35 | 1.17 | 0.11 | 1.22 |

Description of the Reference Signs

10: Organic light-emitting diode (bottom emission type)
11: Substrate
12: Anode conductive layer
13: EL layer
13a: Hole injection layer
13b: Hole transport layer
13c: Light-emitting layer
13d: Light-emitting layer
13e: Light-emitting layer
13f: Electron transport layer
13g: Electron injection layer
14: Cathode conductive layer
15 (a, b, c): Convex portion
16 (a, b, c): Concave portion
21: Template
25 (a, b, c): Convex portion
31: Substrate
35 (a, b, c): Concave portion

The invention claimed is:

1. A method of manufacturing an organic light-emitting diode, comprising:
    preparing a substrate provided with an uneven structure in which a plurality of concave portions or convex portions are arranged in two dimensions on a surface of the substrate using a dry etching method in which a particle single layer film is used as an etching mask; and
    depositing at least an anode conductive layer, an electroluminescent layer comprising a light-emitting layer containing an organic light-emitting material, and a cathode conductive layer containing a metal layer on the uneven structure, whereby the uneven structure is reproduced on a surface of the metal layer on the side of the electroluminescent layer, wherein
    the particle single layer film is formed using a mixture of a plurality of particles having different particle sizes, and the substrate having an uneven structure satisfies requirements (A) and (B) shown below:
    requirement (A): an average height is at least 15 nm but not more than 150 nm,
    requirement (B): a spectral intensity of a height distribution has a finite value across an entire range in which an absolute value |k| of a wave number is denoted by formula (I) shown below, and an integral value of the spectral intensity across the range accounts for 35% or more of an integral value of the spectral intensity across an entire wave number range:

$$\mathrm{Re}\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \leq \quad (\mathrm{I})$$

$$|k| \leq \mathrm{Re}\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right]$$

wherein
$\varepsilon_m(\lambda)$ represents a relative dielectric constant of a metal that constitutes the metal layer,
$\varepsilon_d(\lambda)$ represents an equivalent relative dielectric constant of the electroluminescent layer,
$\lambda_{max}$ represents a maximum extracted wavelength, and
$\lambda_{min}$ represents a minimum extracted wavelength, and
Re[ ] denotes a real part of a complex number.

2. A method of manufacturing an organic light-emitting diode, comprising:
    coating a surface of a base plate with a particle single layer film and dry etching the base plate using the particle single layer film as an etching mask, thereby preparing a template having an uneven structure in which a plurality of unevenness is arranged in two dimensions on a surface of the template; and then
    preparing a substrate by transferring the uneven structure on the surface of the template at least once to another base plate, and depositing at least an anode conductive layer, an electroluminescent layer comprising a light-emitting layer containing an organic light-emitting material, and a cathode conductive layer containing a metal layer on the uneven structure that has been transferred to the substrate, whereby the uneven structure is reproduced on a surface of the metal layer on the side of the electroluminescent layer, wherein
    the particle single layer film is formed using a mixture of a plurality of particles having different particle sizes, and the template having an uneven structure satisfies requirements (A) and (B) shown below:
    requirement (A): an average height is at least 15 nm but not more than 150 nm,
    requirement (B): a spectral intensity of a height distribution has a finite value across an entire range in which an absolute value |k| of a wave number is denoted by formula (I) shown below, and an integral value of the spectral intensity across the range accounts for 35% or more of an integral value of the spectral intensity across an entire wave number range:

$$\mathrm{Re}\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \leq \quad (\mathrm{I})$$

$$|k| \leq \mathrm{Re}\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right]$$

wherein
$\varepsilon_m(\lambda)$ represents a relative dielectric constant of a metal that constitutes the metal layer, $\in_d(\lambda)$ represents an equivalent relative dielectric constant of the electroluminescent layer, $\lambda_{max}$ represents a maximum extracted wavelength, and $\lambda_{min}$ represents a minimum extracted wavelength, and Re[ ] denotes a real part of a complex number.

3. The method of manufacturing an organic light-emitting diode according to claim 1, wherein $\lambda_{max}$ is 780 nm and $\lambda_{min}$ is 380 nm.

4. An organic light-emitting diode, comprising a stacked structure in which at least an anode conductive layer, an electroluminescent layer comprising a light-emitting layer containing an organic light-emitting material, and a cathode conductive layer containing a metal layer are stacked on an uneven structure of a substrate provided with the uneven structure in which a plurality of unevenness is arranged in two dimensions on a surface of the substrate, whereby the uneven structure is reproduced on a surface of the metal layer on the side of the electroluminescent layer, wherein the uneven structure satisfies requirements (A1) and (B1) shown below:

requirement (A1): an average height is at least 15 nm but not more than 150 nm, requirement (B1): a spectral intensity of a height distribution has a finite value across an entire range in which an absolute value |k| of a wave number is denoted by formula (I) shown below, and an integral value of the spectral intensity across the range accounts for 35% or more of an integral value of the spectral intensity across an entire wave number range:

$$\text{Re}\left[\frac{2\pi}{\lambda_{max}} \cdot \sqrt{\frac{\varepsilon_m(\lambda_{max}) \cdot \varepsilon_d(\lambda_{max})}{\varepsilon_m(\lambda_{max}) + \varepsilon_d(\lambda_{max})}}\right] \leq \qquad \text{(I)}$$

$$|k| \leq \text{Re}\left[\frac{2\pi}{\lambda_{min}} \cdot \sqrt{\frac{\varepsilon_m(\lambda_{min}) \cdot \varepsilon_d(\lambda_{min})}{\varepsilon_m(\lambda_{min}) + \varepsilon_d(\lambda_{min})}}\right]$$

wherein $\in_m(\lambda)$ represents a relative dielectric constant of a metal that constitutes the metal layer, $\in_d(\lambda)$ represents an equivalent relative dielectric constant of the electroluminescent layer, $\lambda_{max \text{ and }} \lambda_{min}$ represent a maximum value and a minimum value respectively in a region that includes part or all of an emission spectrum of the organic light-emitting diode, wherein $\lambda_{max} - \lambda_{min} > 200$ nm, and Re[ ] denotes a real part of a complex number.

5. The organic light-emitting diode according to claim 4, wherein a shape of concave portions or convex portions which exist within the uneven structure is isotropic in relation to a substrate in-plane direction.

6. An image display device, having an organic light-emitting diode manufactured using the method according to claim 1 in at least a portion of the device.

7. An image display device, having an organic light-emitting diode according to claim 4 in at least a portion of the device.

8. An illumination device, having an organic light-emitting diode manufactured using the method according claim 1 in at least a portion of the device.

9. An illumination device, having an organic light-emitting diode according to claim 4 in at least a portion of the device.

10. A substrate provided with an uneven structure in which a plurality of unevenness is arranged in two dimensions on a surface of the substrate, wherein the uneven structure satisfies requirements (A2) and (B2) shown below:

requirement (A2): an average height is at least 15 nm but not more than 150 nm, requirement (B2): a spectral intensity of a height distribution has a finite value across an entire range in which an absolute value |k| of a wave number is denoted by formula (II) shown below, and an integral value of the spectral intensity across the range accounts for 35% or more of an integral value of the spectral intensity across an entire wave number range:

$$k_1 \leq |k| \leq k_2 \qquad \text{(II)}$$

wherein $k_1$ and $k_2$ satisfy formulas (III) and (IV) shown below, $$13\ \mu m^{-1} < k_1, k_2 < 37\ \mu m^{-1} \qquad \text{(III)}$$

$$k_2 - k_1 \geq 8\ \mu m^{-1} \qquad \text{(IV)}$$

11. The substrate according to claim 10, wherein a shape of concave portions or convex portions which exist within the uneven structure is isotropic in relation to a substrate in-plane direction.

* * * * *